United States Patent
Imamura et al.

(10) Patent No.: US 6,476,503 B1
(45) Date of Patent: Nov. 5, 2002

(54) SEMICONDUCTOR DEVICE HAVING COLUMNAR ELECTRODE AND METHOD OF MANUFACTURING SAME

(75) Inventors: Kazuyuki Imamura, Kawasaki (JP); Yasunori Fujimoto, Kawasaki (JP); Masaaki Seki, Kawasaki (JP); Tetsuya Fujisawa, Kawasaki (JP); Mitsutaka Sato, Kawasaki (JP); Ryuji Nomoto, Kawasaki (JP); Junichi Kasai, Kawasaki (JP); Yoshitaka Aiba, Kawasaki (JP); Noriaki Shiba, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/606,196

(22) Filed: Jun. 29, 2000

(30) Foreign Application Priority Data

Aug. 12, 1999 (JP) .............................. 11-228680
Apr. 20, 2000 (JP) ....................... 2000-119616

(51) Int. Cl.$^7$ .............................................. H01L 23/48
(52) U.S. Cl. ....................... 257/780; 257/737; 257/773; 257/778; 438/615; 361/779
(58) Field of Search ................................ 257/778, 737, 257/773; 438/615, 128; 29/832; 361/779

(56) References Cited

U.S. PATENT DOCUMENTS

| | | | |
|---|---|---|---|
| 5,677,575 A | * 10/1997 | Maeta et al. ................. | 257/778 |
| 5,786,271 A | * 7/1998 | Ohida et al. ................. | 438/615 |
| 5,813,115 A | * 9/1998 | Misawa et al. ............... | 29/832 |
| 5,870,289 A | * 2/1999 | Tokuda et al. ............... | 361/779 |
| 6,133,072 A | * 10/2000 | Fjelstad ....................... | 438/128 |
| 6,229,209 B1 | * 5/2001 | Nakamura et al. .......... | 257/737 |
| 6,285,083 B1 | * 9/2001 | Imai et al. ................... | 257/773 |

FOREIGN PATENT DOCUMENTS

| | | | |
|---|---|---|---|
| JP | 08111437 A | 4/1996 | |
| JP | 09064049 A | 3/1997 | |
| JP | 09260428 A | 10/1997 | |

* cited by examiner

*Primary Examiner*—David Nelms
*Assistant Examiner*—Mai-Huong Tran
(74) *Attorney, Agent, or Firm*—Armstrong, Westerman & Hattori, LLP

(57) ABSTRACT

A semiconductor device including a semiconductor chip sealed with an encapsulating resin. Columnar electrodes are connected to electrode pads of the semiconductor chip, and extend through the encapsulating resin. The columnar electrodes are made from bonding wires and include enlarged outer ends. Solder balls are arranged on the surface of the encapsulating resin and connected to the outer ends of the columnar electrodes. In another example, pin wires are formed by half-cutting bonding wires, bonding one end of each of the bonding wires, and cutting the bonding wires at the half-cut portions.

11 Claims, 35 Drawing Sheets

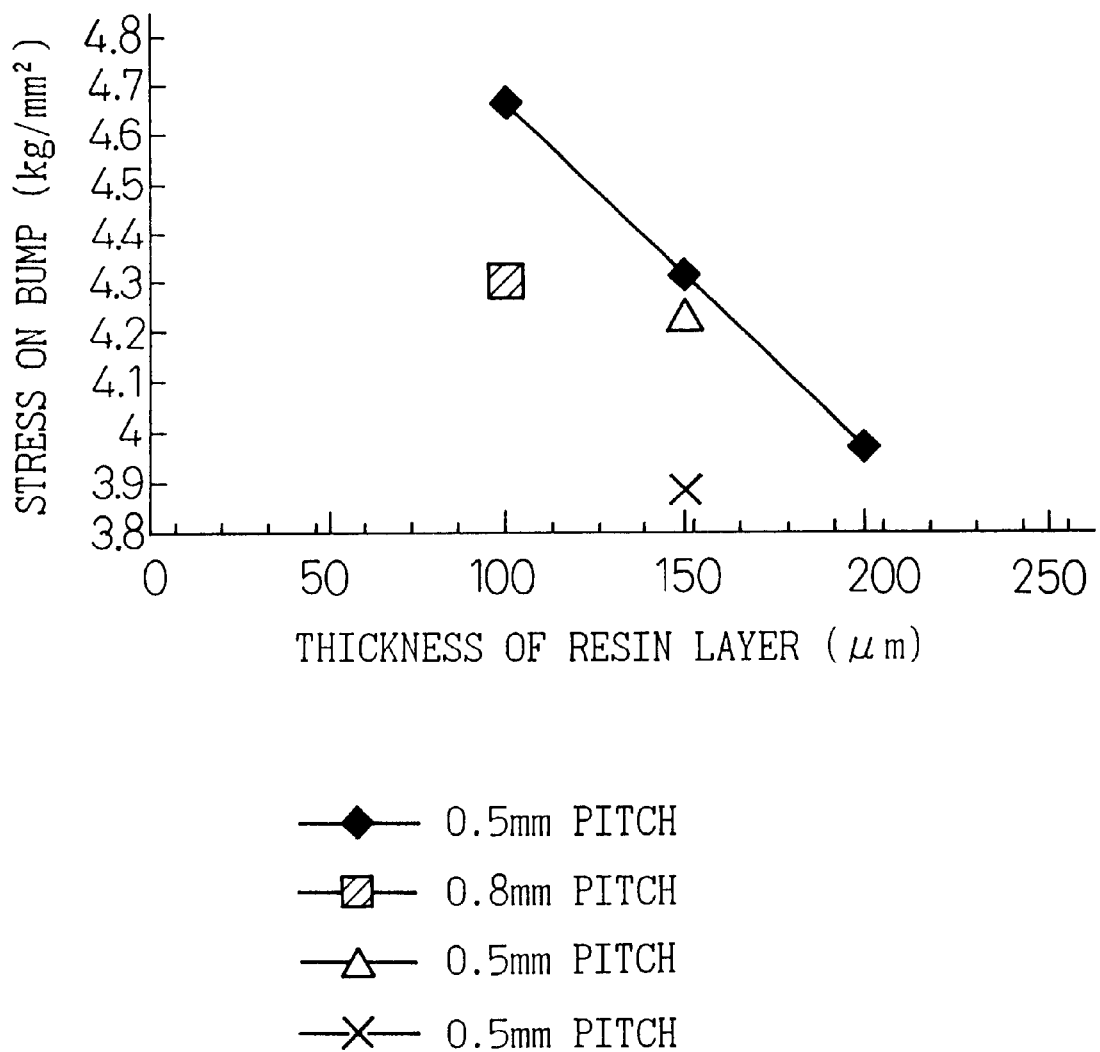

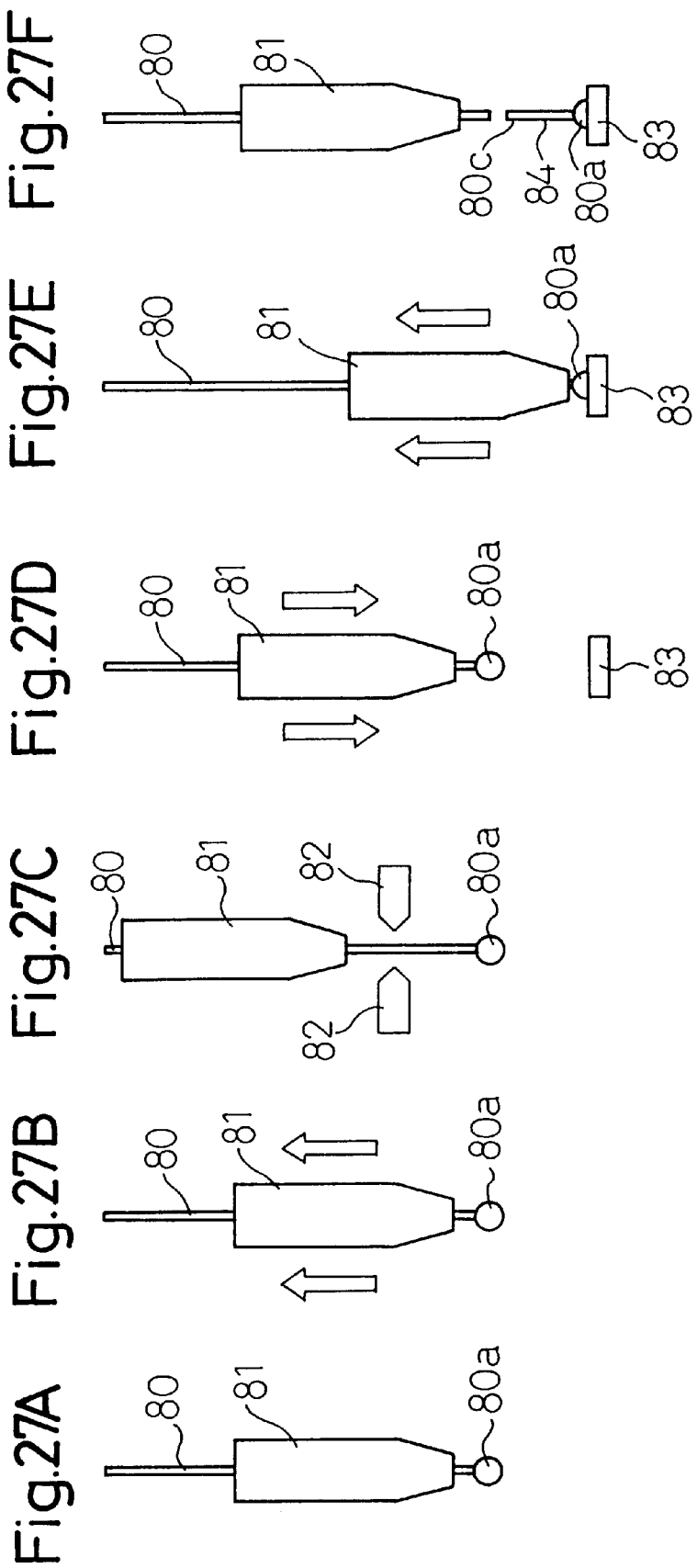

SEMICONDUCTOR DEVICE HAVING COLUMNAR ELECTRODE AND METHOD OF MANUFACTURING SAME

BACKGROUND OF THE INVENTION

1. Field of the Invention

The present invention generally relates to a semiconductor device having columnar electrodes, and to a method for manufacturing a semiconductor device having pin wires.

2. Description of the Related Art

Hitherto, there have been known semiconductor packages each having a resin-sealed semiconductor chip. Semiconductor packages are becoming increasingly smaller. Recently, a semiconductor package having nearly the same size as a semiconductor chip has emerged. Such a semiconductor package is called, for example, a CSP (Chip Size Package).

One method for manufacturing CSPs consists of the steps of forming integrated circuits and electrode pads on a wafer, and then forming columnar electrodes connected to the electrode pads on the wafer, and subsequently sealing the surface of the wafer and the columnar electrodes with resin, and upon completion of the sealing, dicing the wafer to thereby separate semiconductor packages, which include semiconductor chips, from the wafer (see, for instance, Japanese Unexamined Patent Publication (Kokai) No. 9-64049).

A resin layer is formed in such a way as to have nearly the same height as the columnar electrode. A tip end of the columnar electrode is exposed from the surface of the resin layer. An external terminal (or electrode pad) to be connected to each of the columnar electrodes is formed on the resin layer. A solder bump can be provided on this external terminal. Further, a rewiring conductor portion constituted by a conductor pattern is formed on the surface of the wafer, so that the positions of the columnar electrodes differ from those of the electrode pads formed on the wafer.

Moreover, Japanese Unexamined Patent Publication (Kokai) No. 9-260428 discloses that a semiconductor chip is mounted on a mounting substrate by using a metallic wire. An end of the metallic wire is bonded to the electrode pad of the semiconductor chip, while the other end thereof is connected to the mounting substrate by solder. With this constitution, stress generated due to the difference in amount of thermal expansion between the semiconductor chip and the mounting substrate can be absorbed by warpage of the metallic wire.

In the case of using the semiconductor device mounted on the circuit substrate, the external terminal (or solder bump) of the semiconductor device is connected to the electrode pad of the circuit substrate. The semiconductor chip of the semiconductor device faces the circuit substrate thereof across the sealing resin thereof. When the semiconductor device is used, thermal stress is generated in the external terminals and the columnar electrodes owing to the difference in amount of thermal expansion between the semiconductor chip and the substrate of the semiconductor device. Thus, the external terminals and the columnar electrodes become fatigued by repetitive generation of thermal stress.

This thermal stress is directly proportional to the difference in amount of thermal expansion between the semiconductor chip and the circuit substrate of the semiconductor device, and is inversely proportional to the thickness of the sealing resin layer. It is, therefore, preferable for alleviating the stress to increase the thickness of the sealing resin layer. It is, however, necessary, for increasing the thickness of the sealing resin layer, to lengthen the columnar electrodes. Usually, the columnar electrodes are formed by plating. However, there is a limit to a possible increase in the length of the columnar electrodes formed by plating.

Thus, when the columnar electrodes are formed from a (bonding) wire, the columnar electrodes can be lengthened, so that the sealing resin layer can be thickened. However, in the case of using a wire processed by a wire bonder as the columnar electrode, such a wire is too thin to be used as the columnar electrode. Hence, it is desired to make a columnar electrode formed from a wire of sufficient length and strength.

Furthermore, a wire, from which a sufficiently long columnar electrode can be provided, has flexibility. Thus, even when thermal stress is applied on the columnar electrode that is constituted by the wire, the columnar electrode is not destroyed. However, when the sealing resin layer of the semiconductor electrode is hard, large stress is exerted on a joint portion between the columnar electrode, which is constituted by the wire restrained by the sealing resin, and the external terminal fixed to the circuit substrate. It is, therefore, preferable that the sealing resin of the semiconductor device should be as soft as possible.

Further, such a conventional semiconductor device has a drawback in that pressure is applied onto the entire wafer and the wafer is thus damaged when an end portion of the columnar electrode is adjusted by being grounded, and that the flow of resin sometimes causes undesired deformation of the columnar electrode when sealed with the resin.

On the other hand, in recent years, semiconductor devices are required not only to be light and small, but also to operate at a high speed and have an advanced function. In the case that a semiconductor chip is mounted on a device, such as an interposer and a mother board, there has been developed a method of mounting a flip chip device as the semiconductor device, which meets the aforementioned demands, by using solder balls. This conventional method, however, has the following drawbacks. That is, because of a narrow pitch between the electrode pads of the semiconductor chip, the solder balls to be used for connection are specifically designed in such a manner as to have small ball diameters and to show less variation in characteristics thereof and are thus very expensive. Further, because an underfill to be used for sealing the circuit surface is required to have a property by which no voids are generated when filling the narrow gap between the semiconductor chip and the mother board, it is often true that the underfill is specifically designed so as to improve the flowability and adhesionability thereof according to each of the specifications of the semiconductor chip and the mother board. Consequently, the cost of the flip-chip semiconductor device is high.

Additionally, there have been developed a connection method using an adhesive, which contains conductive particles, and another connection method using stud bumps. When using these conventional methods, variation in adhesion is caused owing to the warpage of the semiconductor chip, voids and the leveling accuracy of the terminal thereof. Thus, these conventional methods are low in reliability. There is a fear that the cost of managing such variations will increase.

In the case of the method of mounting the flip chip device, it is possible that metallic wires can be used instead of using solder balls. The use of metallic wires is expedited in the conventional wire bonding system by using an automatic wire bonder. However, in the conventional wire boding system, a tip end of the metallic wire is joined to an end portion of the semiconductor chip. Then, a desired portion of the metallic wire is connected to the electrode of the mother board. Subsequently, a capillary is moved to thereby pull and cut the metallic wire. In this case, the metallic wire is torn off. Thus, the conventional system has a drawback in that the section of the metallic wire is not of a uniform shape, and that the length of the torn metallic wire is not uniform.

SUMMARY OF THE INVENTION

An object of the present invention is to provide a semiconductor device that has superior durability to thermal stress.

To solve such problems, according to an aspect of the present invention, there is provided a semiconductor device which comprises a semiconductor element having a plurality of electrode pads, a plurality of columnar electrodes connected to the plurality of electrode pads, a resin layer covering the semiconductor element and said columnar electrodes and having a surface, and outer terminals disposed on the surface of the resin layer in such a way as to be electrically connected to the columnar electrodes. Each of the columnar electrodes includes a wire portion extending from the electrode pad of the semiconductor element, and an enlarged portion extending from the outer terminals and having a cross-sectional area greater than that of the wire portion thereof.

In this constitution, wires can be used as the columnar electrodes. Thus, the columnar electrodes can be formed in such a manner as to simultaneously have sufficient length, flexibility, and strength. Consequently, the length of the columnar electrodes and the thickness of the sealing resin layer can be increased. Hence, a semiconductor device having superior durability to thermal fatigue can be obtained.

Preferably, the resin layer comprises a first soft resin sub-layer formed on a surface of the semiconductor element and a second resin sub-layer disposed on the opposite side of the first resin sub-layer from the semiconductor element and having elasticity higher than that of the first resin sub-layer.

Preferably, the columnar electrode comprises an extension part of the wire portion subjected to a wall thickening treatment. Alternatively, the enlarged portion of the columnar electrode includes an electrically conductive material attached to the wire portion thereof.

Moreover, according to another aspect of the present invention, there is provided a semiconductor device which comprises a semiconductor element having a plurality of electrode pads, a plurality of columnar electrodes connected to the electrode pads, a resin layer covering the semiconductor element and said columnar electrodes and having a surface, outer terminals disposed on the surface of the resin layer in such a way as to be electrically connected to the columnar electrodes, and re-wiring conductor portions provided between the electrode pads and the columnar electrodes of the semiconductor element. The resin layer is made of relatively soft spin-coated resin.

In this constitution, the resin layer is made of relatively soft spin-coated resin. This imparts flexibility to the portion between the columnar electrodes and the external terminals formed in the semiconductor chip. Thus, the reliability of the joint portion between the columnar electrodes and the outer terminals against thermal stress and mechanical stress can be ensured. Especially, the combination of the soft resin and the soft columnar electrode imparts high flexibility to the sealing resin layer and the columnar electrodes against thermal fatigue. Consequently, a semiconductor device having superior durability to thermal fatigue can be obtained.

Preferably, the resin layer is made of one of a silicon resin and an epoxy resin. These resins are suitable for spin coating.

The columnar electrode comprises a wire. Further, each of the columnar electrodes is formed by partially expanding a wire. Alternatively, the columnar electrode is formed by joining a plurality of wires into a single columnar electrode.

Preferably, the semiconductor device further comprises dummy electrodes disposed in the resin layer substantially parallel to the columnar electrodes. Alternatively, the semiconductor device further comprises a resin column disposed in the resin layer in such a manner as to be nearly parallel to the columnar electrodes.

Furthermore, according to another aspect of the present invention, there is provided a semiconductor device which comprises a semiconductor element having a plurality of electrode pads, a plurality of columnar electrodes connected to the electrode pads, a resin layer covering the semiconductor element and the columnar electrodes and having a surface, re-wiring conductor portions provided on the surface of the resin layer in such a way as to be connected to the columnar electrodes, an insulating layer covering the resin layer and a part of the re-wiring conductor portion, and outer terminals electrically connected to part of the re-wiring conductor portions, which part is exposed from the insulating layer.

In this constitution, the re-wiring conductor portions are provided on the surface of the resin layer. Moreover, the insulating layer covers the resin layer and a part of the re-wiring conductor portions. The outer terminals are electrically connected to the part of the re-wiring conductor portions, which is exposed from the insulating layer. The re-wiring conductor portion is not covered with the resin layer. Thus, the re-wiring conductor portion has flexibility.

Furthermore, according to another aspect of the present invention, there is provided a method for manufacturing a semiconductor device, which comprises the steps of half-cutting metallic wires at desired positions, which have a first ends, bonding the first ends of the metallic wires to electrode portions of a semiconductor element or a semiconductor device, and cutting each of the metallic wires at the desired positions by pulling the metallic wires relative to the electrode portions, to thereby form pin wires. The pin wires have a cut second ends.

In this constitution, half-cutting is performed on the metallic wires at the desired positions. Then, after the first ends of the metallic wires are bonded to the electrode portions of the semiconductor element, each of the metallic wires is reliably and completely cut at the desired positions when the metallic wires is pulled to the electrode portions. The wire portions of the metallic wires have a uniform shape. The metallic wires have uniform length. Therefore, in the case of the semiconductor element having a plurality of pin wires, the pitch of which is narrow, the plurality of pin wires have nearly constant height. Thus, the semiconductor element is rendered suitable for being joined to other devices, such as a mother board.

BRIEF DESCRIPTION OF THE DRAWINGS

The present invention will become more apparent from the following description of the preferred embodiments, with reference to the accompanying drawings, in which:

FIG. 5 is a graph illustrating the relationship between the thickness of the resin layer and stress at the outer terminals;

FIGS. 27A to 27F are views illustrating a method of manufacturing a semiconductor device having pin wires according to the fourth embodiment of the present invention;

FIGS. 38A to 38C are views illustrating an example of the semiconductor device having pin wires with a conductive material adhered to tip ends thereof; in which FIG. 38A illustrates the step of immersing pin wires provided in the semiconductor element into a conductive material in a bath; FIG. 38B illustrates the step of making a conductive material adhere to the pin wires provided in the semiconductor element, by dipping the pin wires into the conductive material in concave portions of a forming plate; and FIG. 38C illustrates the step of mounting the semiconductor element having pin wires and the conductive material on an interposer or a mother board;

DESCRIPTION OF THE PREFERRED EMBODIMENTS

Embodiments of the present invention will now be described with reference to the accompanying drawings.

Figure 1:
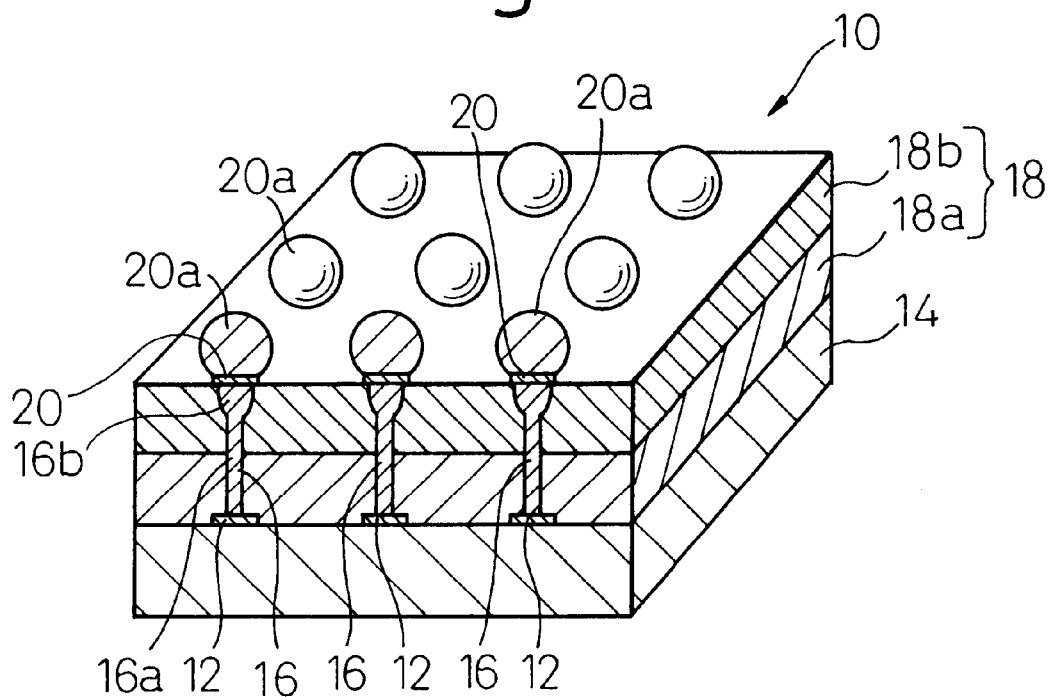
FIG. 1 is a partially sectional perspective view illustrating a semiconductor device according to the first embodiment of the present invention.
Figure 2:
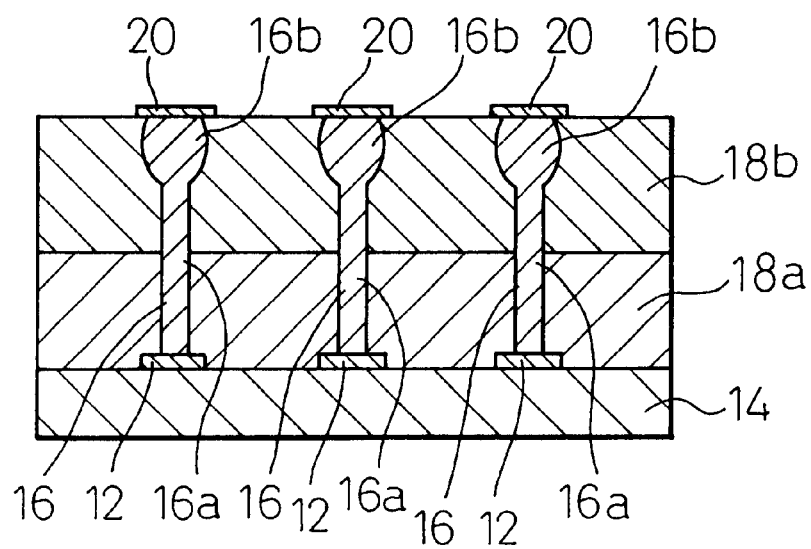
FIG. 2 is a sectional view illustrating the semiconductor device of FIG. 1, before adhesion of solder balls to electrode pads.

FIG. 1 is a partially sectional perspective view illustrating a semiconductor device 10 according to the first embodiment of the present invention. FIG. 2 is a sectional view illustrating the semiconductor device 10 of FIG. 1, in a state before the adhesion of solder balls to electrode pads.

In FIGS. 1 and 2, the semiconductor device 10 comprises a semiconductor element 14 having a plurality of electrode pads 12, a plurality of columnar electrodes 16 connected to the electrode pads 12 and extending perpendicular to the semiconductor element 14, a resin layer 18 covering the semiconductor element 14 and the columnar electrodes 16, and outer terminals 20 disposed on the surface of the resin layer 18 and connected to the columnar electrodes 16.

The semiconductor element 14 is constituted by a silicon chip, and includes an integrated circuit (not shown) and the electrode pads 12 suitably connected to this integrated circuit. The outer terminals 20 are electrode pads that are disposed on the surface of the resin layer 18 and connected and fixed to the ends of the columnar electrodes 16. Further, solder balls 20a are connected and fixed to the outer terminals 20.

The resin layer 18 comprises a first soft resin sub-layer 18a, which is formed on the surface of the semiconductor element 14, and a second resin sub-layer 18b which is placed in such a manner as to be more distant from the semiconductor element 14 than the first resin sub-layer and as to have elasticity that is higher than that of the first resin sub-layer 18a. The first resin sub-layer 18a is made of a low elasticity resin, such as a silicone resin or a low elasticity epoxy resin, which has a Young's modulus of several to several hundreds kg/mm$^2$. The second resin sub-layer 18b is made of a high elasticity resin, such as a high elasticity epoxy resin, which has a Young's modulus of 1000 to 2000 kg/mm$^2$.

Each of the columnar electrodes 16 has a wire portion 16a, which extends from the corresponding electrode pad 12 of the semiconductor element 14 and has an almost constant cross-sectional area along the direction of an axis thereof, and an enlarged portion 16b that extends from the outer terminal 20a and has a cross-sectional area larger the cross-section area of the wire portion 16a. Therefore, basically, each of the columnar electrodes 16 is constituted by a wire, and has sufficient length and flexibility, and the joint region between the columnar electrode 16 and the outer terminal 20 is reinforced by providing the enlarged portion 16b therein. For example, the columnar electrodes 16 are formed from gold wires. The diameter of the wire portion 16a of each of the columnar electrodes 16 ranges from 30 to 50 $\mu$m. The diameter of the enlarged portion 16b is two to three times the diameter of the wire portion 16a. The diameter of each of the outer terminals 20 ranges from a value which is equal to the value of the diameter of the enlarged portion 16b to half the bump pitch.

Figure 3:
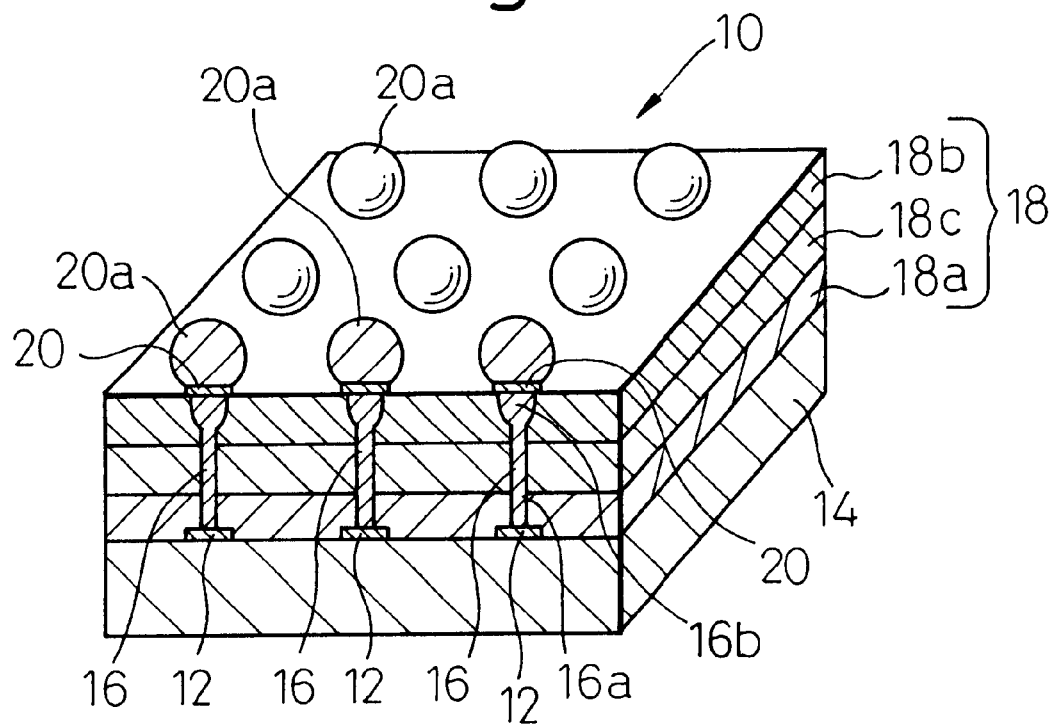
FIG. 3 is a view illustrating a modification of the semiconductor device of FIG. 1.

FIG. 3 is a view illustrating a modification of the semiconductor device 10 of FIG. 1. As in the case of the example of FIG. 1, the semiconductor device 10 comprises a semiconductor element 14 having a plurality of electrode pads 12, a plurality of columnar electrodes 16 connected to the electrode pads 12, a resin layer 18 covering the semiconductor element 14 and the columnar electrodes 16, and outer terminals 20 disposed on the surface of the resin layer 18 in such a way as to be electrically connected to the columnar electrodes 16.

Each of the columnar electrodes 16 has a wire portion 16a, which extends from the corresponding electrode pad 12 of the semiconductor element 14 and has an almost constant cross-sectional area along the direction of an axis thereof, and an expansion portion 16b that extends from the external terminal 20a and that has a cross-sectional area larger than the cross-section area of the wire portion 16a. Therefore, basically, each of the columnar electrodes 16 is constituted by a wire, and has sufficient length and flexibility. Moreover, the joint region between the columnar electrode 16 and the outer terminal 20 is reinforced by providing the enlarged portions 16b therein.

In this embodiment, the resin layer 18 comprises a first soft resin sub-layer 18a, which is formed on the surface of the semiconductor element 14, a second resin sub-layer 18b which is placed in such a manner as to be more distant from the semiconductor element 14 than the first resin sub-layer and has elasticity that is higher than that of the first resin sub-layer 18a, and a third resin sub-layer 18c that is interposed between the first resin sub-layer 18a and the second resin sub-layer 18b and that aids in adhering the first resin sub-layer to the second resin sub-layer. Fundamentally, an operation of this embodiment is similar to those of the embodiment illustrated in FIGS. 1 and 2.

Figure 4:
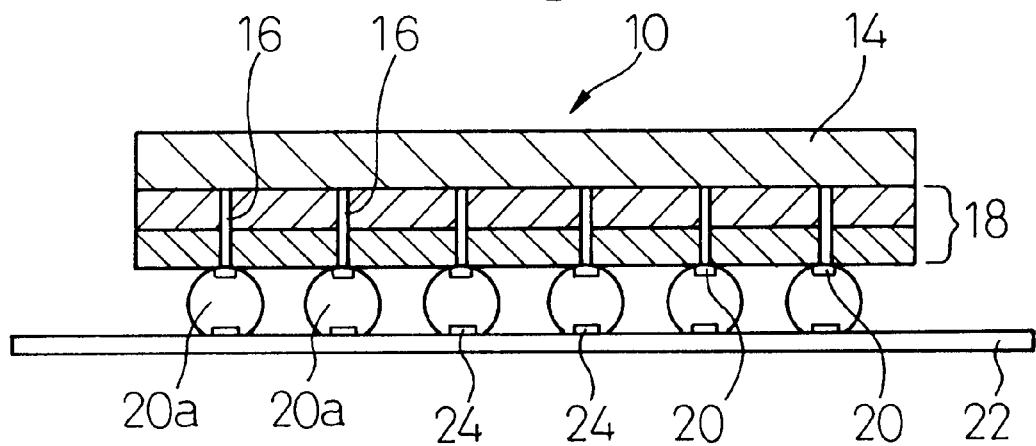
FIG. 4 is a view illustrating an example in which the semiconductor device of FIG. 1 is mounted on a circuit substrate.

FIG. 4 is a view illustrating an example in which the semiconductor device of FIG. 1 is mounted on a circuit substrate. The circuit substrate 22 has electrode pads 24 arranged in the same manner as the outer terminals 20 and the solder balls 20*a* of the semiconductor device 10. The semiconductor device 10 is mounted on the circuit substrate 22 by joining the outer terminals 20 (or the solder balls 20*a*) to the electrode pads 24. Thus, the semiconductor element 14 faces the circuit substrate 22 across the resin layer 18.

During use, the semiconductor element 14 and the circuit substrate 22 expand and contract by the action of heating elements. The difference in amount of deformation between the semiconductor element 14 and the circuit substrate 22 is caused according to the difference in coefficient of thermal expansion therebetween. This results in the generation of thermal stress among the columnar electrodes 16 and the outer terminals 20 (and other members). The outer terminals 20 and the columnar electrodes 16 of the semiconductor device 10 are fatigued by the repetitive generation of thermal stress.

However, according to the present invention, the columnar electrodes 16 can be constituted so that each of the electrodes 16 has sufficient length and flexibility, by constituting the columnar electrodes 16 fundamentally by the wire portion 16*a*, and a sufficient strength at least at the joint region between the columnar electrode 16 and the outer terminal 20, by providing the enlarged portions 16*b*. Hence, the length of the electrodes 16 and the thickness of the sealing resin layer 18 can be increased, and consequently, a semiconductor device 10 having superior durability to the thermal fatigue is obtained.

FIG. 5 is a graph illustrating the relationship between the thickness of the resin layer 18 and stress (namely, bump stress) at the outer terminals 20. The thicker the resin layer 18, the lower the (bump) stress at the outer terminals 20. Examples indicated by rectangular marks and lozenge marks include only a single resin layer 18, and "A" denotes the elastic modulus of this resin layer.

In the case of the example indicated by the rectangular marks, the outer terminals 20 are placed at a pitch of 0.8 mm. When the thickness of the resin layer 18 is 100 $\mu$m, the bump stress is 4.3 kg/mm$^2$. In the case of the example indicated by the lozenge marks, the outer terminals 20 are placed at a pitch of 0.5 mm. When the thickness of the resin layer 18 is 150 $\mu$m, the bump stress is 4.3 kg/mm$^2$.

In the example indicated by triangular marks, the elastic modulus of the resin sub-layer 18*a* is set at (1/6)A, and the elastic modulus of the resin sub-layer 18*b* is at A. In the example indicated by cross marks, the elastic modulus of the resin sub-layer 18*a* is set at (1/6)A, and the elastic modulus of the resin sub-layer 18*b* is at 5A. In all of these cases, the thickness of the first resin sub-layer 18*a* is 50 $\mu$m, and that of the second resin sub-layer 18*b* is 10 $\mu$m. Thus, even in the case that reduction in size of the terminals is expedited in the future, the joint stress of the bump can be sufficiently reliably obtained. The low elasticity first resin sub-layer 18*a* may be a silicon resin or a low elasticity epoxy resin, which has a Young's modulus of several to several hundred kg/mm$^2$. The high elasticity second resin sub-layer 18*b* may be a high elasticity epoxy resin, which has a Young's modulus of 100 to 2000 kg/mm$^2$.

Figure 6A:
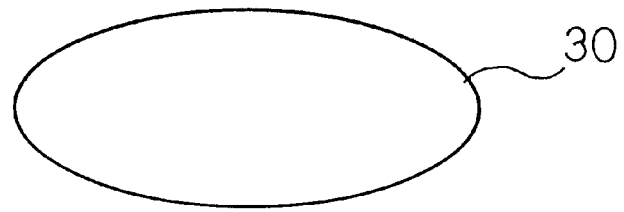
FIGS. 6A to 6D are views illustrating an example of a method of manufacturing a semiconductor device, including the steps of forming an integrated circuit on a wafer, causing solder balls adhere thereto, and separating the water into individual semiconductor devices.
Figure 6B:
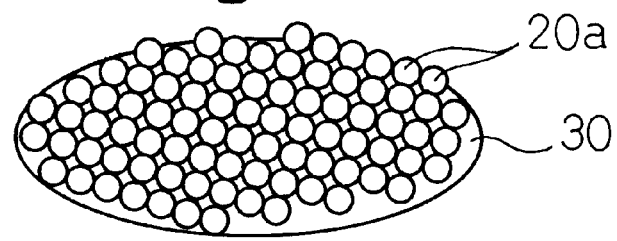
Figure 6C:
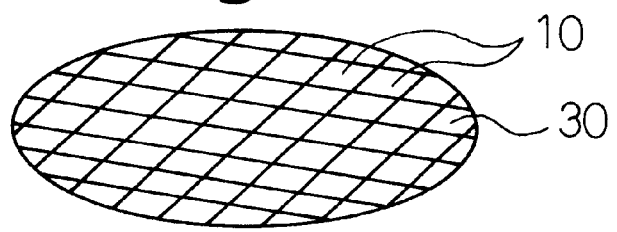
Figure 6D:
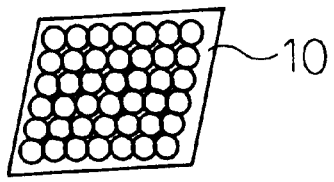

FIGS. 6A to 6D are views illustrating an example of a method of manufacturing the semiconductor devices 10 illustrated in FIGS. 1 to 3. FIG. 6A illustrates the step of forming the integrated circuit, the electrode pads 12, and the columnar electrodes 16 on a silicon wafer 30. FIG. 6B illustrates the step of forming the resin layer 18 and the solder balls 20*a* on the wafer 30. FIG. 6C illustrates the step of dicing the silicon wafer 30 having the solder balls 20*a* formed thereon into individual semiconductor devices 10. FIG. 6D illustrates the separated semiconductor device 10. As can be seen from FIGS. 6A to 6D, the semiconductor device 10 of the present invention is formed by forming the sealing resin layer 18 on the silicone wafer 30 and subsequently forming individual semiconductor devices as chip size packages (CSPs) each including a semiconductor chip. Therefore, the sealing resin layer 18 can be applied thereto by spin coating.

Figure 7A:
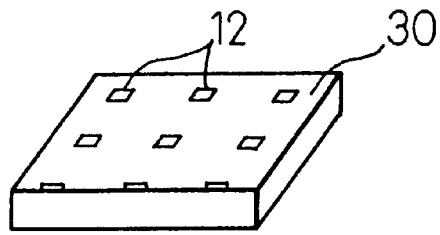
FIGS. 7A to 7F are views illustrating an example of a method of manufacturing a semiconductor device, including the step of forming enlarged portions on outer terminals.
Figure 7D:
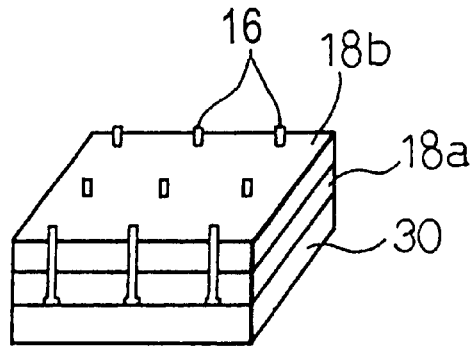
Figure 7B:
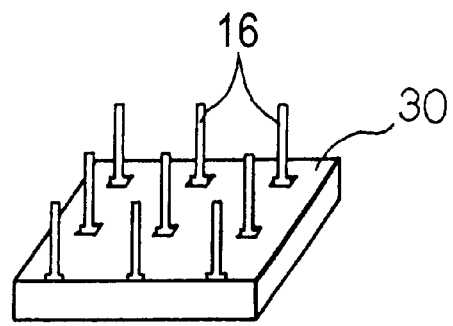
Figure 7E:
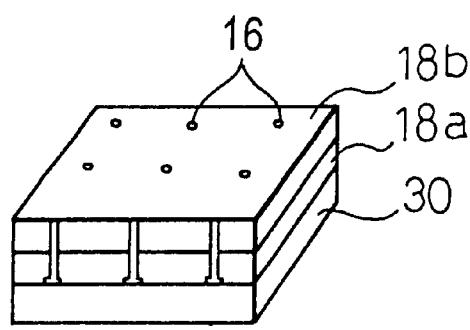
Figure 7C:
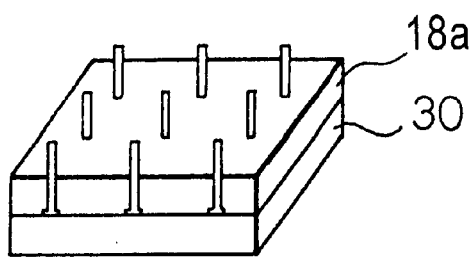
Figure 7F:
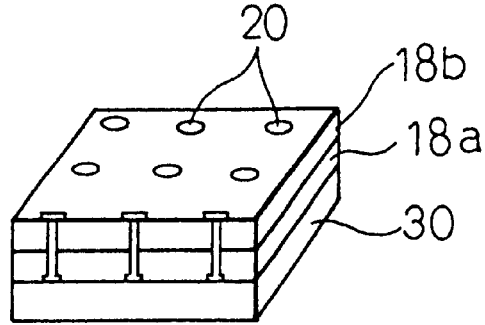

FIGS. 7A to 7F are views illustrating an example of a method of manufacturing a semiconductor device, which includes the steps of forming the resin layer an then forming an enlarged portion in each of the outer terminals. As illustrated in FIG. 7A, an integrated circuit and the electrode pads 12 are formed on the wafer 30. Then, as illustrated in FIG. 7B, the columnar electrodes 16 connected to the electrode pads 12 are formed. The columnar electrodes 16 each include the wire portion 16*a* and the enlarged portion 16*b*, as shown in FIGS. 1 to 3. Then, as illustrated in FIG. 7C, the first resin sub-layer 18*a* is formed. Subsequently, as illustrated in FIG. 7D, the second resin sub-layer 18*b* is formed. Then, as illustrated in FIG. 7E, the second resin sub-layer 18*b* is polished, and an end portion of each of the columnar electrodes 16, which portion projects from the second resin sub-layer 18*b*, is cut off. At that time, only the end parts of the enlarged portions 16*b* are cut off. Subsequently, as illustrated in FIG. 7F, the external terminals 20 are formed at the end parts of the enlarged portions 16*b* of the columnar electrodes 16. Then, as illustrated in FIG. 6B, the solder balls 20*a* are formed. Subsequently, as illustrated in FIG. 6C, the wafer 30 is cut and divided into the individual semiconductor devices 10.

Figure 8A:
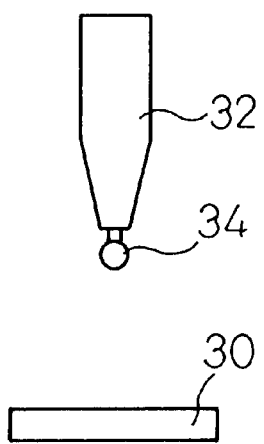
FIGS. 8A to 8F are views illustrating an example of method of forming a columnar electrodes having enlarged portions.
Figure 8B:
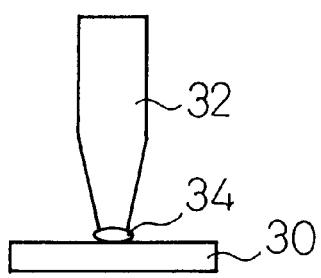
Figure 8C:
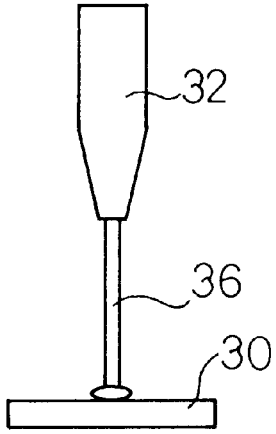

FIGS. 8A to 8F are views illustrating an example of a method of forming the columnar electrodes having enlarged portions. In this example, the columnar electrodes 16 are formed from the bonding wires 36, using a wire bonder. A commercially available wire bonder may be utilized. First, as illustrated in FIG. 8A, a capillary 32 of the wire bonder is caused to descend to the electrode pad 12 of the wafer 30. A small lump 34 of a wire material is formed at the end portion of the capillary 32. Then, as illustrated in FIG. 8B, the capillary 32 is further lowered to the wafer 30 so that the small lump 34 of the wire material formed at the end portion of the capillary 32 contacts the wafer 30. Subsequently, as illustrated in FIG. 8C, the capillary 32 is lifted up, so that the bonding wire 36 is formed. In ordinary wire bonding, the capillary 32 is caused to go down to and touch another electrode pad. According to the present invention, the capillary 32 is lifted straight in a direction nearly perpendicular to the wafer 30 maintaining the wire in a nearly constant cross-sectional area. For instance, when gold wires are used, the wires can be lifted to a place, whose height is about 500 $\mu$m, in the case that the diameter thereof is 30 to 50 $\mu$m.

Figure 8D:
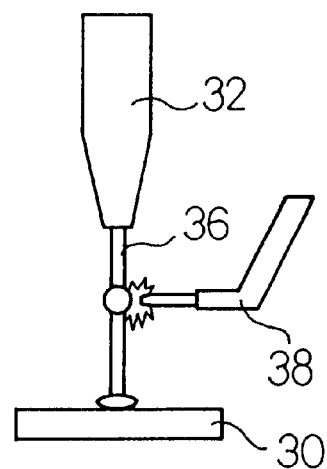
Figure 8E:
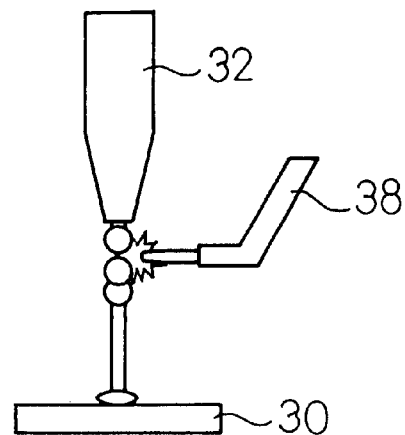
Figure 8F:
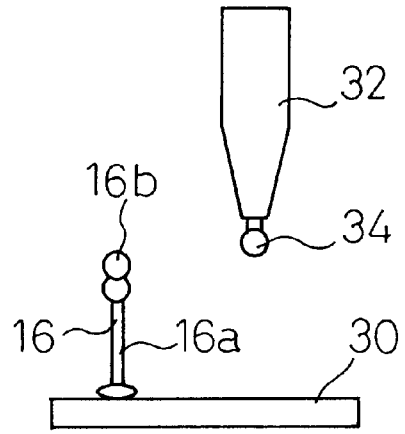

Then, as illustrated in FIG. 8D, when electric sparks are applied to the bonding wire 36 by an electric spark generator 38, a part of the bonding wire 36 is shaped like a small round lump. At that time, the energy of the electric spark is set at a value sufficiently low to the extent that the bonding wires 36 are not cut off. Subsequently, as illustrated in FIG. 8E, electric sparks are again applied thereto until the small lump of the material formed at the end portion of the bonding wire has a suitable size (for example, two to three times the diameter of the bonding wire 36). Finally, electric sparks are applied thereto with energy sufficient to the extent that the bonding wire 36 is cut off. Thus, as illustrated in FIG. 8F, the bonding wire 36 is cut off, and the capillary 32 is moved to the next point.

Figure 9:
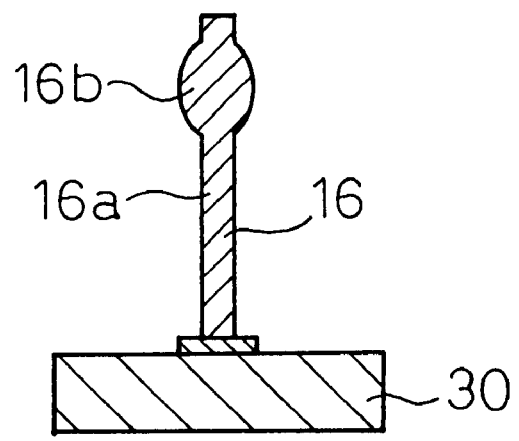
FIG. 9 is a view illustrating the columnar electrode formed by the method illustrated in FIGS. 8A to 8F.

FIG. 9 is a view illustrating the columnar electrode 16 which is formed in this manner and which has the wire portion 16a and the enlarged portion 16b. Incidentally, the size of the outer terminal 20 to be connected to the enlarged portion 16b is set at a value ranging from the size of the enlarged portion 16b to about half the bump pitch.

Figure 10:
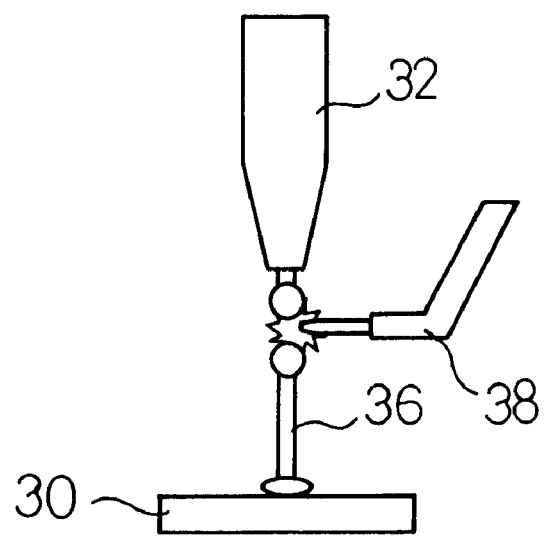
FIG. 10 is a view illustrating another example of the method of forming the columnar electrodes having enlarge portions.

FIG. 10 is a view illustrating another example of a method of forming the columnar electrodes each having an enlarged portion. In this example, the columnar electrodes 16 are formed from bonding wires by using a wire bonder. As in the example shown in FIGS. 8A to 8D, the capillary 32 is lifted upwardly from the electrode pad 12 provided on the wafer 30, and the bonding wire 36 is formed, as illustrated in FIG. 10. Then, electric sparks are applied to the bonding wire 36 by using the electric spark generator 38. At that time, the energy of the electric sparks is set at a sufficient level to the extent that a part of the bonding wire 36 is rounded like a small lump thereof and that the bonding wire 36 is cut off at the small lump of the material. Thus, the columnar portion 16 having the wire part 16a and the enlarged part 16b is formed.

Figure 11:
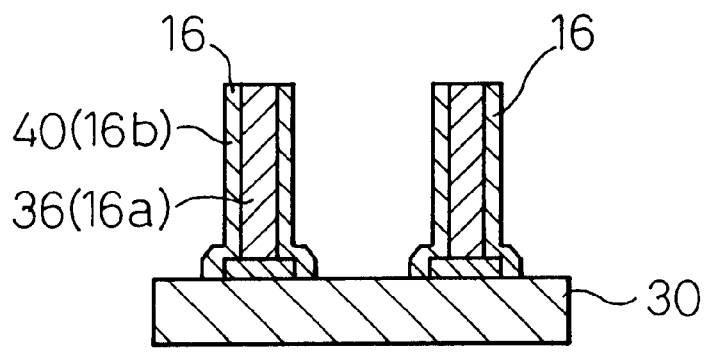
FIG. 11 is a view illustrating yet another example of a method of forming columnar electrodes.

FIG. 11 is a view illustrating another example of a method of forming the columnar electrode 16. In this example, the bonding wire 36 is formed by a wire bonder. Then, a plating layer 40 is formed on the surface of the bonding wire 36. For instance, the bonding wire 36 is made of copper and has a diameter of 50 to 100 μmm. The plating layer 40 is a solder plating layer and has a diameter that is 1.5 to 2 times the diameter of the bonding wire 36. The size of the outer terminal 20 connected to the enlarged part 16b is within a range between the size of enlarged part 16b and a size that is about half the bump pitch.

In this example, the bonding wire 36 becomes the wire part extending from the electrode pad 12 of the semiconductor element 14. The plating layer 40 becomes the enlarged part 16b that extends from the outer terminal 20 and that has a cross-sectional area larger than the wire portion 16a. In this example, the formation of the columnar electrode 16 is performed before the resin layer 18 is formed. Thereafter, the columnar electrode 16 is covered with the resin layer 18.

Figure 12:
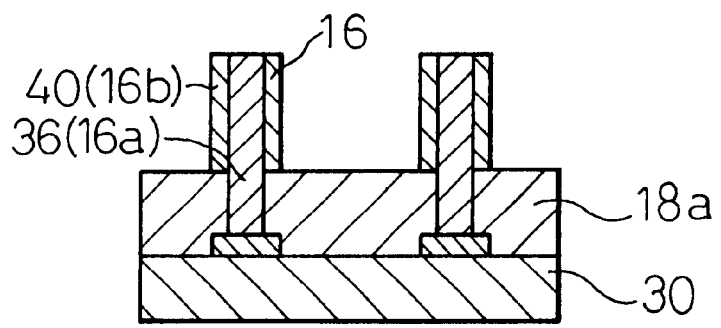
FIG. 12 is a view illustrating a further example of a method of forming columnar electrodes.

FIG. 12 is a view illustrating still another example of a method of forming the columnar electrode 16. In this example, the bonding wire 36 is formed by a wire bonder. Then, a plating layer 40 is formed on the surface of the bonding wire 36, similarly to the example illustrated in FIG. 11. The bonding wire 36 is the wire part extending from the electrode pad 12 of the semiconductor element 14. The plating layer 40 is the enlarged part 16b that extends from the outer terminal 20 and that has a cross-sectional area larger than the wire portion 16a. In this example, the formation of the bonding wire 36 is performed before the first resin sub-layer 18a is formed. Thereafter, the bonding wire 36 is covered with the first resin sub-layer 18a. The plating layer 40 is applied onto a part, which is not covered with the first resin sub-layer 18a, of the bonding wire 36. Thereafter, the plating layer 40 is covered with the second resin sub-layer 18b.

Figure 13:
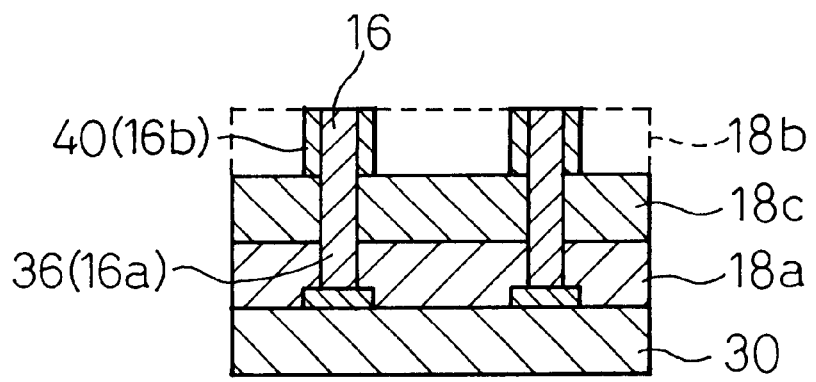
FIG. 13 is a view illustrating a further example of a method of forming columnar electrodes.

FIG. 13 is a view illustrating yet another example of a method of forming the columnar electrode 16. In this example, the bonding wire 36 is formed by a wire bonder. Then, a plating layer 40 is formed on the surface of the bonding wire 36, similarly to the example illustrated in FIG. 11. The bonding wire 36 is the wire part extending from the electrode pad 12 of the semiconductor element 14. The plating layer 40 is the enlarged part 16b that extends from the outer terminal 20 and that has a cross-sectional area larger than the wire portion 16a. In this example, the resin layer 18 contains first to third resin sub-layers 18a, 18b, and 18c. The formation of the bonding wire 36 is performed before the first resin sub-layer 18a is formed. Thereafter, the bonding wire 36 is covered with the first and third resin sub-layers 18a and 18c. The plating layer 40 is applied onto a part, which is not covered with the first and third resin sub-layers 18a and 18c, of the bonding wire 36. Thereafter, the plating layer 40 is covered with the second resin sub-layer 18b.

Figure 14:
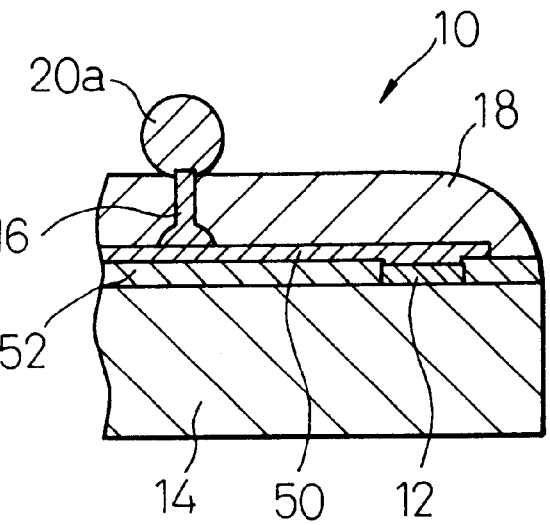
FIG. 14 is a partially sectional perspective view illustrating a semiconductor device according to the second embodiment of the present invention.

FIG. 14 is a partially sectional perspective view illustrating a semiconductor device according to the second embodiment of the present invention. The semiconductor device 10 comprises a semiconductor element 14 having a plurality of electrode pads 12, a plurality of columnar electrodes 16 connected to the electrode pads, a resin layer 18 covering the semiconductor element 14 and the columnar electrodes 16, and solder balls 20a serving as outer terminals 20 disposed on the surface of the resin layer 18 in such a way as to be electrically connected to the columnar electrodes 16, and re-wiring conductor portions 50 provided between the electrode pad 20 and the columnar electrode 16 of the semiconductor electrode 16.

An insulating layer 52 is formed on the surface of the semiconductor element 14, and the electrode pads 12 are exposed from opening portions of the insulating layer 52. The re-wiring conductor portions 50 have respective electrode pad parts corresponding to the electrode pads 12 in a one-to-one correspondence relationship. The electrode pad parts of the re-wiring conductor portions 50 are electrically connected to the electrode pads 12 of the semiconductor element 14. The columnar electrodes 16 are fixed and connected to the electrode pad parts. The electrode pads 12 are formed at a limited position on the semiconductor element 14, while the electrode pad parts of the re-wiring conductor portions 50 can be formed in a desired pattern. Therefore, the electrode pad parts of the re-wiring conductor portions 50 are relatively uniformly arranged. Consequently, a force exerted on the resin layer 18 can be scattered to the joint portion between the specific columnar electrodes 16 and the solder balls 20a serving as the outer terminal.

Although the solder balls 20a are used as the outer terminals in this embodiment, needless to say, the electrode pads are formed on the surface of the resin layer 18 and used as the outer terminals 20, as in the aforementioned first embodiment.

The resin layer 18 is made of relatively soft spin-coated resin. In other words, the resin layer 18 is made of a silicone resin or a low elasticity epoxy resin, which is sufficiently soft to the extent that spin coating can be performed. Further, the columnar electrodes 16 are formed mainly from bonding wires.

Conventional columnar electrodes are formed as a plating layer. Thus, it is difficult to increase the thickness of the conventional columnar to a large value. Moreover, the conventional columnar electrodes are quite hard. Furthermore, the conventional sealing resin layer is constituted by a high elasticity hard epoxy resin. Thus, the hard columnar electrode is embedded in the hard sealing resin layer. When the circuit substrate facing the surface of the sealing resin is moved by thermal stress with respect to the sealing resin, a force is exerted on the external terminal. Further, the force is transmitted to the columnar electrode. However, because the columnar electrodes are difficult to move, the joint portion between the external terminal and the columnar electrode is liable to be damaged.

In the present invention, the columnar electrodes 16 formed from the bonding wire is flexible, and the sealing resin layer 18 surrounding the columnar electrodes 16 is soft and flexible. Thus, when the circuit substrate facing the surface of the sealing resin layer 18 is moved by thermal stress with respect to the sealing resin layer 18, a force is exerted on the solder balls 20 and the force is transmitted to the columnar electrodes 16. However, the columnar electrodes flexibly move in such a way as to follow the movement of the solder balls 20, so the joint portion between the solder balls 20a and the columnar electrodes 16 is difficult to damage.

Figure 15:
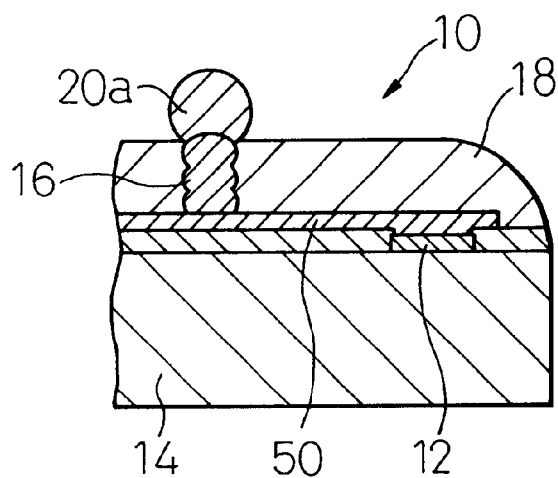
FIG. 15 is a view illustrating a modification of the semiconductor device of FIG. 14.

FIG. 15 is a view illustrating a modification of the semiconductor device of FIG. 14. In this example, the columnar electrode 16 formed from the bonding wire is enlarged as a whole. This example is effective in obtaining a thick columnar electrode when the bonding wire is too thin.

Figure 16:
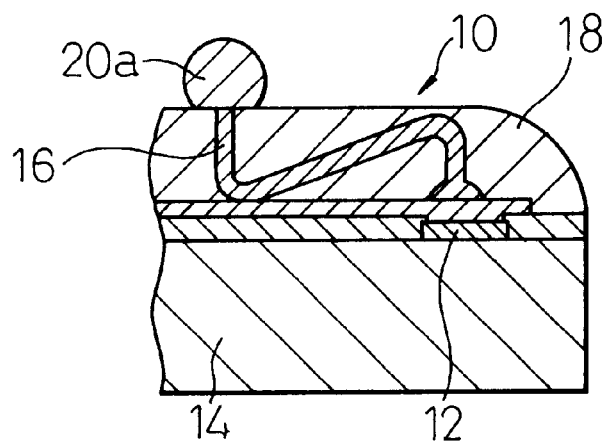
FIG. 16 is a view illustrating another modification of the semiconductor device of FIG. 14.

FIG. 16 is a view illustrating another modification of the semiconductor device of FIG. 14. In this example, an end portion of the bonding wire constituting the columnar electrode 16 is joined to the re-wiring conductor portion 50. Then, the bonding wire extending therefrom is bent at a middle portion thereof and joined to the re-wiring conductor potion 50 again. Further, the rest of the bonding wire extends to the surface of the resin layer 18. This example is effective in obtaining a more flexible columnar electrode 16. Furthermore, even in the case that a break occurs in the re-wiring conductor portion 50, the column electrode 16 may compensate for such a break.

Figure 17A:
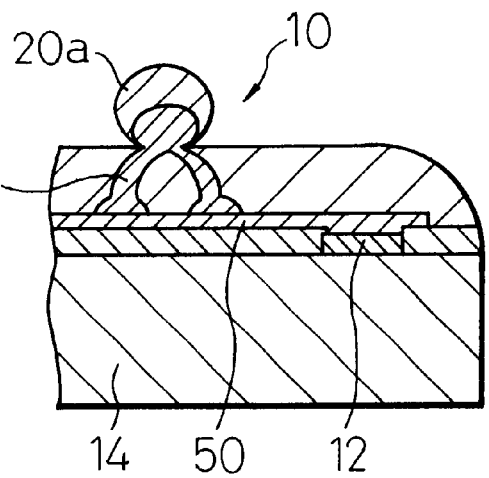
FIG. 17A is a view illustrating a modification of the semiconductor device of FIG. 14.
Figure 17B:
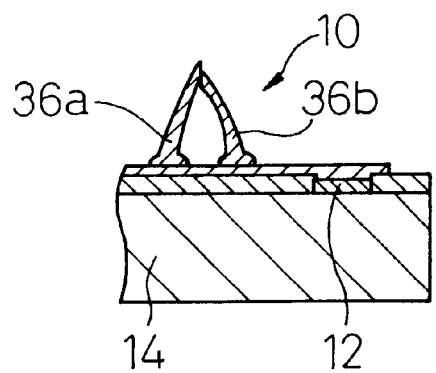
FIGS. 17B to 17D are views illustrating a method of forming columnar electrodes of the semiconductor device of FIG. 17A.
Figure 17C:
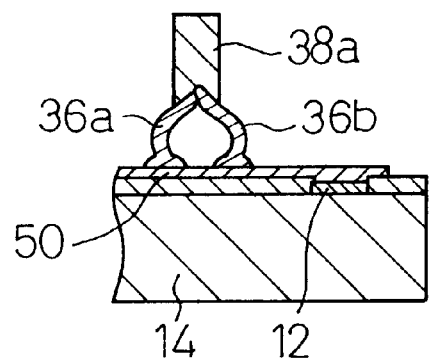
Figure 17D:
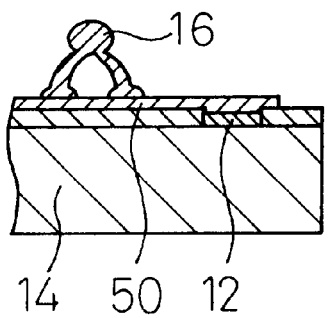

FIG. 17A is a view illustrating another example of a modification of the semiconductor device of FIG. 14. In the case of this example, a plurality of bonding wires are joined into a single columnar electrode 16. This example is effective in increasing the strength of the columnar electrode 16 and in obtaining a flexible columnar electrode 16. FIGS. 17B to 17D illustrate the process of manufacturing the columnar electrode 16 of FIG. 17A. First, as illustrated in FIG. 17B, two bonding wires 36a and 36b are formed for obtaining a single columnar electrode 16. Then, as illustrated in FIG. 17C, a discharge produced by an electric torch 38a is applied to the ends of the two bonding wires 36a and 36b. Thus, as illustrated in FIG. 17D, the ends of the two bonding wires 36a and 36b are joined to each other. Further, the heights of a large number of columnar electrodes 16 can be averaged by controlling upward and downward movements of the electric torch 38a.

Figure 18:
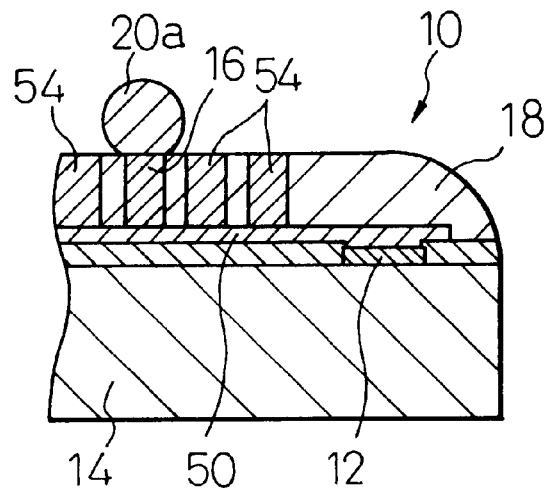
FIG. 18 is a view illustrating a further modification of the semiconductor device of FIG. 14.

FIG. 18 is a view illustrating another modification of the semiconductor device of FIG. 14. In the case of this example, the resin layer 18 contains a dummy electrode 54 disposed in such a manner as to be nearly parallel to the columnar electrode 16. The columnar electrode 16 and the dummy electrode 54 are joined to the re-wiring conductor portion 50. An end of the columnar electrode 16 is joined to the solder ball 20a, whereas an end of the dummy electrode 54 is not joined to the solder ball 20a. Therefore, the dummy electrode 54 does not work electrically. However, the dummy electrode 54 prevents a force, which is generated owing to a flow of resin, from being exerted to the columnar electrode 16 in a concentrated manner when the resin layer 18 is formed.

Figure 19:
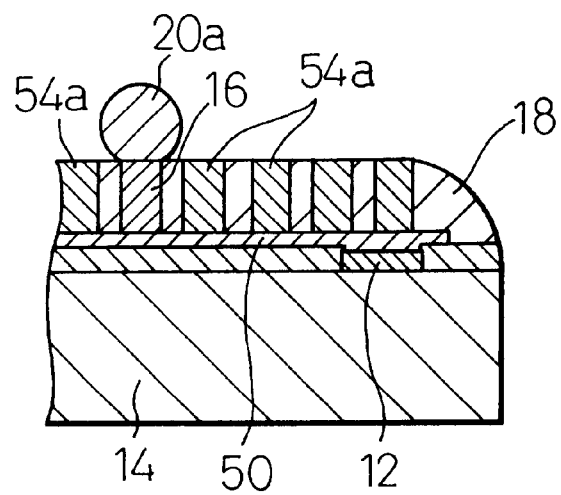
FIG. 19 is a view illustrating a modification of the semiconductor device of FIG. 18.

FIG. 19 is a view illustrating a modification of the semiconductor device of FIG. 18. In this example, the resin layer 18 contains a dummy electrode 54a disposed in such a manner as to be nearly parallel to the columnar electrode 16. This dummy electrode 54a is made of, for example, a silicone resin or a low elasticity resin. The dummy electrode 54a prevents a force, which is generated owing to a flow of resin, from being exerted to the columnar electrode 16 in a concentrated manner when the resin layer 18 is formed. Furthermore, the dummy electrode 54a makes the flow of resin uniform to thereby aid in flattening the surface of the resin layer 18.

Figure 20:
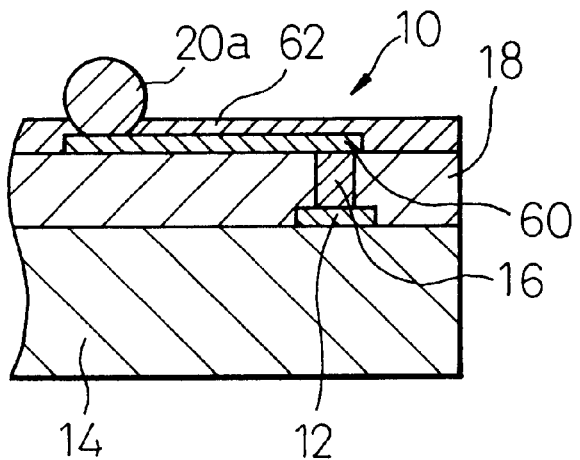
FIG. 20 is a partially sectional perspective view illustrating a semiconductor device according to the third embodiment of the present invention.

FIG. 20 is a partially sectional perspective view illustrating a semiconductor device according to the third embodiment of the present invention. The semiconductor device 10 comprises a semiconductor element 14 having a plurality of electrode pads 12, a plurality of columnar electrodes 16 connected to the electrode pads 12, a resin layer 18 covering the semiconductor element 14 and the columnar electrodes 16, re-wiring conductor portions 60 connected to the columnar electrodes 16 provided on the surface of the resin layer 18 between the electrode pads 20 and the columnar electrodes 16, an insulating layer 62 for covering a part of the resin layer 18 and the re-wiring conductor portions 60, and solder balls 20a serving as outer terminals 20 in such a way as to be electrically connected to parts of the re-wiring conductor portions 60, which are exposed from the insulating layer 62. In this case, although the solder balls 20a are used as the outer terminals, needless to say, the electrode pads can be formed on the surface of the resin layer 18 and used as the outer terminals 20, similarly as in the case of the aforementioned embodiments.

That is, in the case of this semiconductor device 10, the columnar electrode 16 is formed on each of the electrode pads 12 of the semiconductor element 14, and after the semiconductor element 14 and the columnar electrodes 16 are sealed with the resin layer 18, the patterning of the re-wiring conductor portions 60 is performed. The insulating layer 62 is subsequently formed. Thus, the solder balls 20a serving as the outer terminals are connected to the re-wiring conductor portions 60. The re-wiring conductor portion 60 is not covered with the resin layer 18. Therefore, the re-wiring conductor portions 60 are flexible. Consequently, the stress exerted on the joint portion between the re-wiring conductor portion 60 and the solder ball 20a serving as the outer terminal can be dispersed.

Figure 21A:
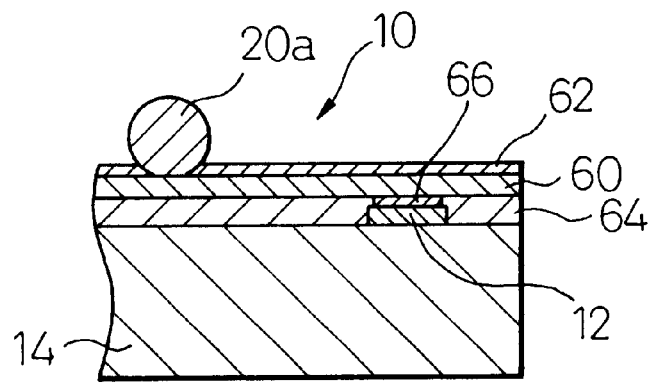
FIGS. 21A to 21D are views illustrating modifications of the semiconductor device of FIG. 20.

FIG. 21A is a view illustrating a modification of the semiconductor device of FIG. 20. The semiconductor device 10 comprises a semiconductor element 14 having a plurality of electrode pads 12, an insulating layer 64 covering a part of the semiconductor element 14, re-wiring conductor portions 60 connected to the electrode pads 12, which are exposed from the insulating layer 64 and provided on the surface of the insulating layer 64, an insulating layer 62 covering a part of the insulating layer 64 and the re-wiring conductor portions 60, and solder balls 20a serving as outer terminals 20 disposed in such a way as to be electrically connected to a part of the rewiring conductor portion 60 which is exposed from the insulating layer 62. The columnar electrodes 16 are joint members 66 between the electrode pads 12 and the re-wiring conductor portions 60.

That is, in this semiconductor device 10, the insulating layer 64 is formed on the semiconductor element 14, and a part of the insulating layer 64, which is placed on the electrode pad 12, is opened. Then, the patterning of the re-wiring conductor portions 60 onto the insulating layer 64 is performed. Thereafter, the insulating layer 62 is formed. Thus, the solder balls 20a serving as the outer terminals are connected to the re-wiring conductor portions 60. Because the re-wiring conductor portions 60 are not covered with the resin layer 18, the conductor portions 60 are flexible. Consequently, the stress exerted on the joint portions between the re-wiring conductor portions 60 and the solder balls 20a serving as the outer terminals can be scattered.

Figure 21B:
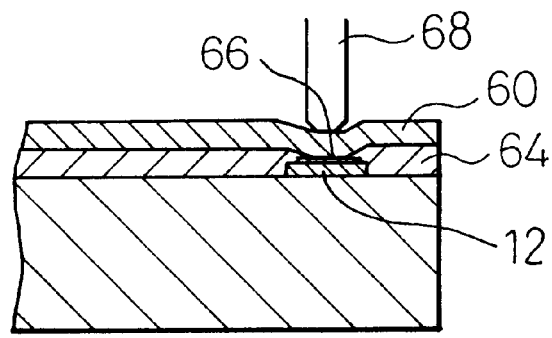

FIG. 21B is a view illustrating an example of formation of an alloy layer 66 of the electrode pad 12 and the re-wiring conductor portion 60. The alloy layer 66 is constituted by a eutectic alloy of aluminum and gold. When ultrasonic thermocompression bonding of the re-wiring conductor portion 60, which is obtained by gold-plating of copper, to the aluminum electrode pad 12 is performed by using a bonding tool 68, a eutectic alloy of aluminum and gold is formed. Thus, the alloy layer 66 is formed from this alloy.

Figure 21C:
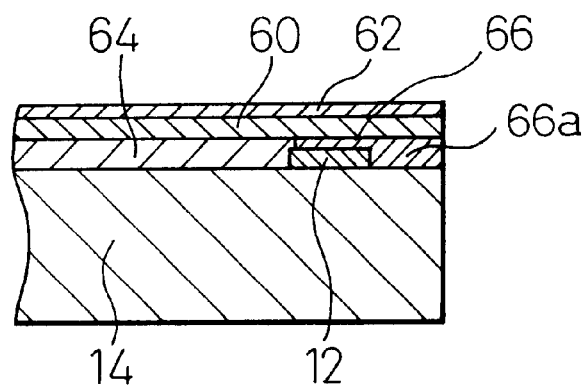
Figure 21D:
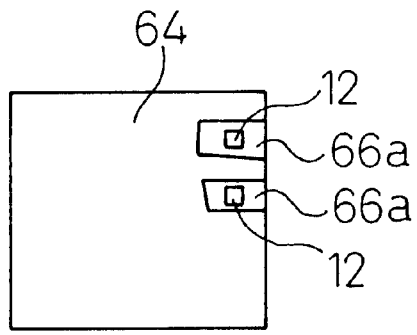

FIGS. 21C and 21D are views illustrating an example of formation of the joint member 66 between the electrode pad 12 and the re-wiring conductor portion 60. FIG. 21C is a sectional view of the semiconductor device 10, and FIG. 21D is a schematic plan view of the insulating layer 64. A portion of the insulating layer 64, which is placed on the electrode pad 12, is opened. In the opening portion, a plating layer 66a is applied onto the insulating layer 64. This plating layer 66a becomes the joint member 66. To deposit the plating layer, the insulating layer is designed so that the part of the insulating layer 64, which is disposed on the electrode pad 12, is exposed to the plating bath.

Figure 22A:
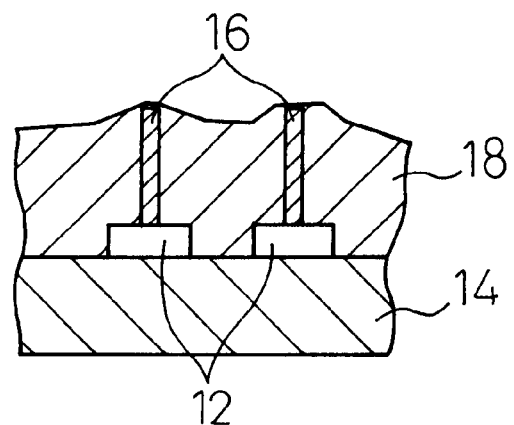
FIGS. 22A and 22B are views illustrating a method of exposing columnar electrodes of the semiconductor devices illustrated in FIGS. 14 to 20.
Figure 22B:
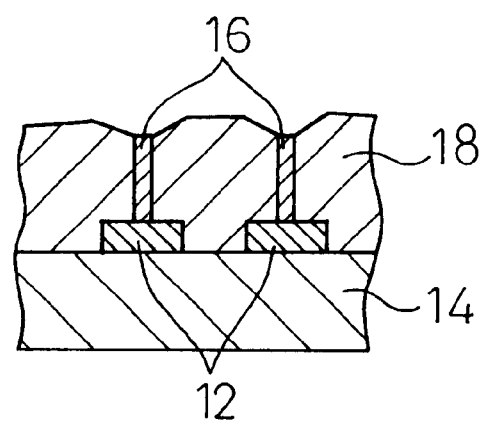

FIGS. 22A and 22B are views illustrating a method of exposing the columnar electrodes of the semiconductor device illustrated in FIGS. 14 to 20. In the semiconductor device 10 comprising the semiconductor element 14 having a plurality of electrode pads 12, a plurality of columnar electrodes 16 connected to the electrode pads 12, and a resin layer 18 covering the semiconductor element 14 and the columnar electrodes 16, the following two relations (a) and (b) are established between the surface of the resin layer 18 and the ends of the columnar electrodes 16 just after the resin layer 18 is coated. That is, (a) the ends of the columnar electrodes 16 protrude from the surface of the resin layer 18 (see FIG. 7D); and (b) the ends of the columnar electrodes 16 and the surface of the resin layer 18 are almost at the same level. An example, which will be described hereinbelow, relates to the case (b).

FIG. 22A illustrates a state just after the resin layer 18 is coated. In this state, the top ends of the columnar electrodes 16 and the top surface of the resin layer 18 are almost at the same level. In this case, a film of the material of the resin layer 18 adheres to the ends of the columnar electrodes 16. Thus, as illustrated in FIG. 22B, the film of the material of the resin layer 18 should be removed from the ends of the columnar electrodes 16 so as to electrically connect the ends of the electrodes 16 to the outer electrodes 20. In this case, it is unnecessary to remove the entire surface of the resin layer 18. It is sufficient to eliminate only the film provided on a part of the surface of the resin layer 18, at which the end of each of the columnar electrodes 16 is positioned.

Figure 23:
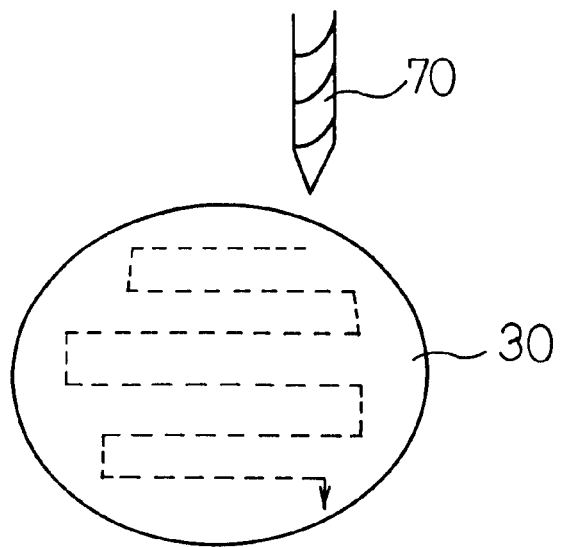
FIG. 23 is a view illustrating an example of a method of exposing the columnar electrodes of FIG. 22.

FIG. 23 is a view illustrating an example of a method of exposing the columnar electrodes of FIGS. 22A and 22B. The wafer 30 coated with the resin layer 18 is prepared, and the surface of the resin layer 18 is traced, by using a tool 70 such as a drill or a file, along the positions of all the columnar electrodes 16 in sequence. Then, the film of the material of the resin layer 18 at the ends of the columnar electrodes 16 is removed, and the ends of the electrodes 16 are exposed. Consequently, the electrode pads 20 or the solder balls 20, which serve as the outer electrodes, can be thereafter formed at the ends of the columnar electrodes 16. According to this method, a smaller force is exerted on the wafer 30, as compared with the case of grinding the entire surface of the resin layer 18 by a grinder. Consequently, the wafer 30 is not damaged.

Figure 24A:
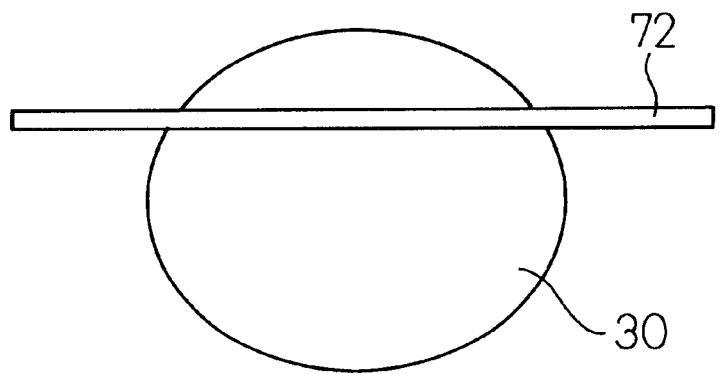
FIGS. 24A and 24B are views illustrating another example of a method of exposing the columnar electrodes of FIG. 22.
Figure 24B:
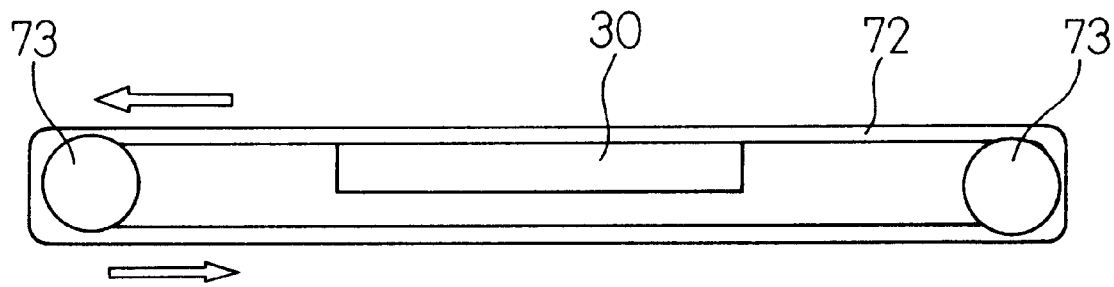

FIGS. 24A and 24B are views illustrating another example of a method of exposing the columnar electrodes of FIG. 22. FIG. 24A is a plan view, and FIG. 24B is a side view. In this example, an endless band member of sandpaper or metal 72 is used. The band member 72 is rotated along arrows indicated in FIG. 24B. In this example, the band member 72 is wound around two rollers 73. The metallic band member 72 may be used in a reel take-up system or a sequence-of-reels system. The upper running portion of the band member 72 is placed in such a manner as to be in contact with the top surface of the wafer 30, while the lower running portion of the band member 72 is placed below the bottom surface of the wafer. Thus, only the parts of the surface of the resin layer 18, at which the columnar electrodes are provided, are removed to thereby expose the ends of the columnar electrodes 16. Therefore, in this case, a smaller force is applied onto the wafer 30, as compared with the case of grinding the entire surface of the resin layer 18 by a grinder. Consequently, the wafer 30 is not damaged.

Figure 25A:
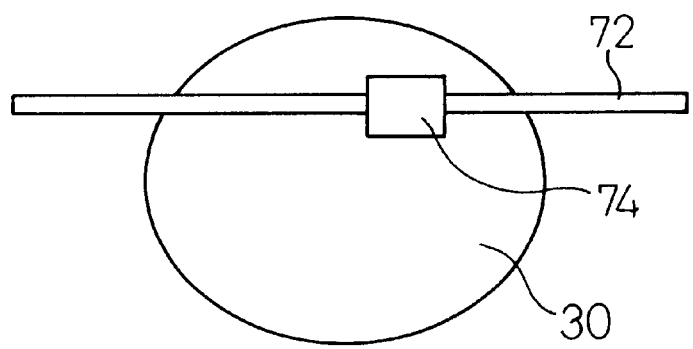
FIGS. 25A and 25B are views illustrating a modification of the method of exposing the columnar electrodes illustrated in FIG. 24.
Figure 25B:
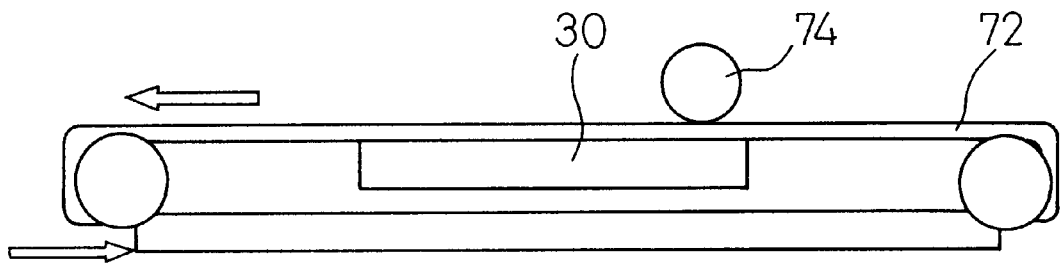

FIGS. 25A and 25B are views illustrating another modification of the method of exposing the columnar electrodes illustrated in FIG. 24. In this example, the band member 72 is used. Further, a heater 74 capable of heating the band member 72 is provided therein. The removal of a part of the surface of the resin layer 18 is assisted by heating the band member 72.

Figure 26A:
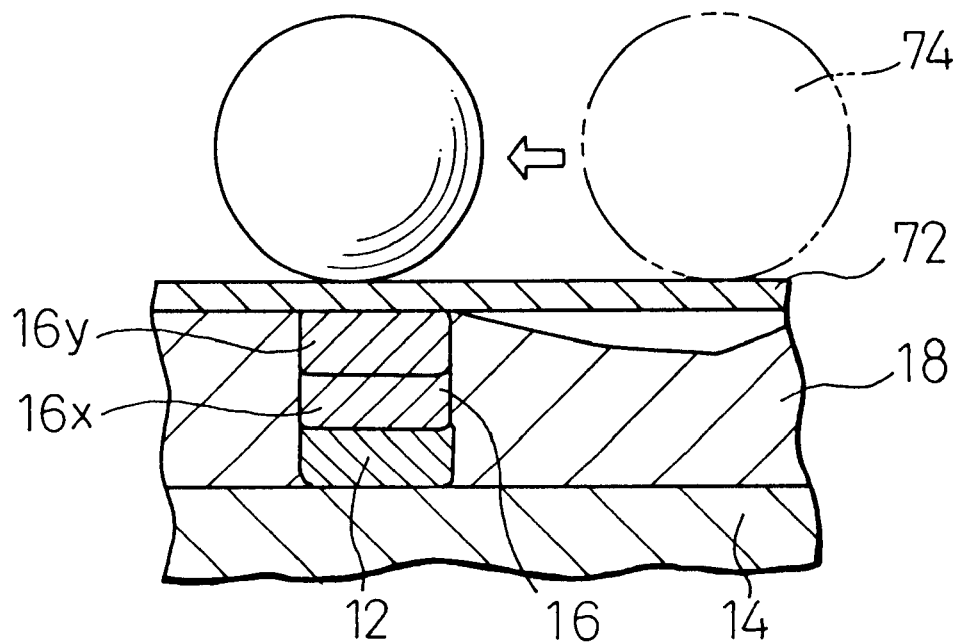
FIGS. 26A and 26B are views illustrating another modification of the method of exposing the columnar electrodes illustrated in FIG. 24.
Figure 26B:
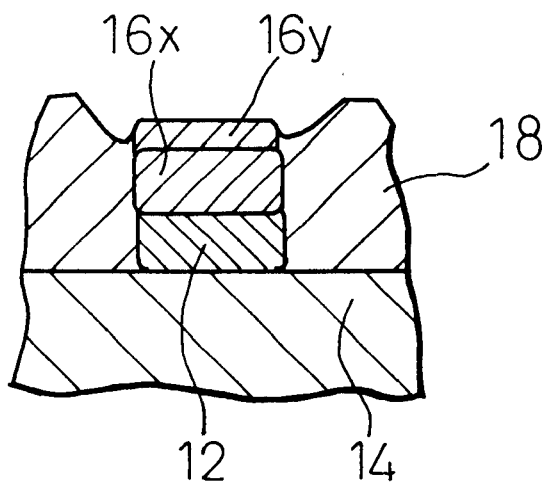

FIGS. 26A and 26B are views illustrating still another modification of the method of exposing the columnar electrodes illustrated in FIG. 24. In this example, the electrode pad 12 is made of gold and the columnar electrode 16 includes a gold portion 16x and a solder portion 16y. The band member 72 of copper and the heater 74 are used.

When the copper band member 72 is rotated during heated, a part of the surface of the resin layer 18 is removed, and the copper band member 72 reacts with the solder portion 16y of the columnar electrode 16, so that the solder portion 16y of the columnar electrode 16 is adhered to the copper band member 72. Thus, the end portion of the columnar electrode 16 is exposed. In this case, if the surface of the copper band member 72 is roughened and flux is applied thereto, the solder portion 16y may be easily adhered. Further, the solder portion 16y of the columnar electrode 16 can be adhered to the copper band member 72 and the top surface of the electrode can be removed, by rotating the copper band member 72 along the end portion of the columnar electrode 16, after the flux is applied to the columnar electrode 16, and heating the band member to a temperature higher than the melting point of solder. Furthermore, if the portion next to the solder portion 16y in the columnar electrode 16 is made of copper, copper is adhered to one side of the solder portion 16y, and to the other side of the solder portion 16y. Thus, stresses due to adhesion are made uniform.

A method for manufacturing a semiconductor device having pin wires according to the fourth embodiment of the present invention will be described hereinbelow with reference to FIGS. 27A to 27F. The pin wire is formed from a bonding wire, similar to the columnar electrode 16 of the aforementioned embodiments, and can be used in a manner similar to the columnar electrode 16. However, the pin wire of this embodiment can be used for a larger number of applications, as compared with the columnar electrode 16 of the aforementioned embodiments.

As shown in FIG. 27A, a metallic wire 80 is inserted into a capillary 81. The capillary 81 is one of a conventional wire bonder. The metallic wire 80 is a wire made of a metal used for wire bonding, for example, a gold wire. The bottom portion of the metallic wire 80, which is disposed at the lower side of the capillary 81, is a ball-like enlarged portion 80*a*. The enlarged portion 80*a* is formed by, for instance, heating or discharging, as in conventional wire bonding.

In FIG. 27B, the capillary 81 is moved with respect to the metallic wire 80, as indicated by arrow, so that a suitable spacing is established between the bottom portion of the capillary 81 and the enlarged portion 80*a*, and a part of a predetermined length of the metallic wire 80 is exposed.

In FIG. 27C, a tool 82 for a half-cutting process is arranged to move in connection with the metallic wire 80 and the capillary 81. The tool 82 is actuated to half-cut the metallic wire 80 at a predetermined position, so that the metallic wire 80 is physically weakened or partially cut. In this embodiment, the tool 82 comprises a pair of blades each disposed on either side of the metallic wire 80 and operated to move toward and away from each other.

Figure 28:
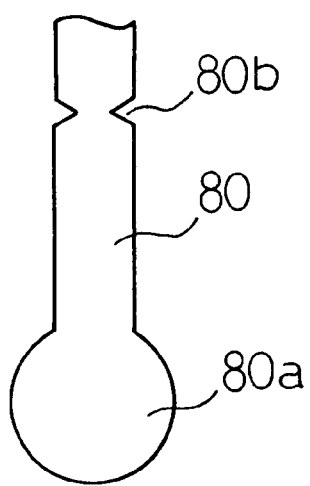
FIG. 28 is an enlarged view illustrating the metallic pin wire of FIGS. 27A to 27F, which is subjected to a half-cutting operation.

FIG. 28 illustrates the metallic wire 80 which is subjected to the half-cutting process. A wedge-like depression 80*b* is formed at a position at which the metallic wire 80 is half cut. The position of the tool 82 is set so that pin wire of a predetermined length can be obtained from the metallic wire 80. Incidentally, the tool 82 for the half-cutting process is not provided in conventional automatic wire bonders, and such a tool 82 is added thereto so as to practice the present invention.

In FIG. 27D, the capillary 81 is moved to an initial position, as indicated by arrow. Thus, the bottom portion of the capillary 81 is made to come closer to the enlarged portion 80*a* of the metallic wire 80. This state corresponds to a start position for the conventional wire bonding. Subsequently, the capillary 81 and the metallic wire 80 are caused to descend still further to an electrode portion 83 of a desired electronic device. The enlarged portion 80*a* of the metallic wire 80 is pressed to the electrode portion 83 by the bottom portion of the capillary 81, and the enlarged portion 80*a* of the metallic wire 80 is joined or fastened to the electrode portion 83. At the time of thermo-compression bonding, heat or high-frequency vibration can be given thereto, similarly to the case of performing conventional wire bonding.

In FIG. 27E, the capillary 81 is then lifted, as indicated by arrow when the enlarged portion 80*a* of the metallic wire 80 is joined to the electrode portion 83. Since the enlarged portion 80*a* of the metallic wire 80 is joined to the electrode portion 83, the metallic wire 80 does not move and only the capillary 81 is lifted.

In FIG. 27F, the metallic wire 80 is clamped by a clamper provided in the capillary 81 when the capillary 81 is lifted a certain distance, and the capillary 81 is further lifted. Then, the metallic wire 80 is pulled and reliably cut at the position of the depression 80*b*, at which the half cutting is performed. Thus, the cut metallic wire 80 becomes a pin wire 84 having an end portion 80*c*.

Figure 29A:
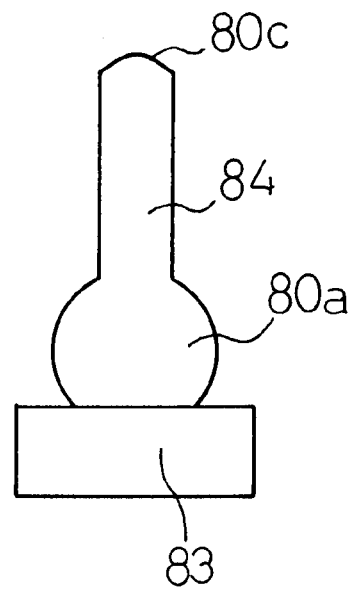
FIGS. 29A and 29B are enlarged side views illustrating the cut metallic wire (or pin wire) illustrated in FIGS. 27A to 27F and 28.
Figure 29B:
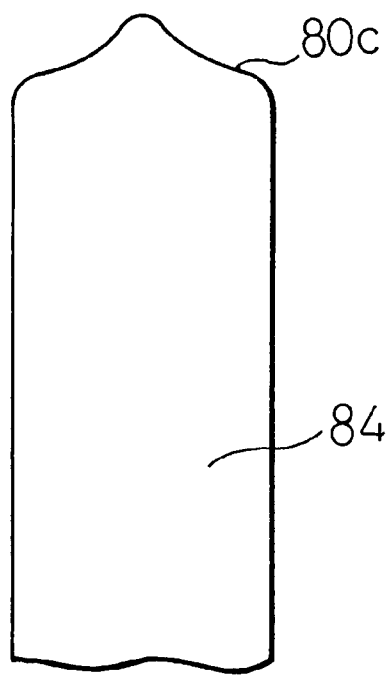

FIG. 29A illustrates the pin wire 84 formed in this way. FIG. 29B illustrates a part of the pin wire 84 in an enlarged scale. According to the present invention, the pin wire 84 is reliably cut at the position of the depression 80*b* of the metallic wire 80, so there is less variation in length of the obtained pin wire 84. Further, owing to the influence of the half cutting, the end portion of the pin wire 84 becomes a almost uniform and stably shaped projection.

In the case that a metallic wire 80 which is not half-cut, is cut, the cut position is not accurately specified, the cut portion of the metallic wire 80 is not uniform, and there is a large variation in length of the pin wires. According to the present invention, since the metallic wire 80 is cut after mechanical half cutting is performed thereon, the metallic wire 80 is reliably cut at the position at which the half cutting is performed, and variation in length thereof is reduced. Further, owing to the influence of the half cutting, the end portion of the pin wire 84 becomes a almost uniformly shaped projection with a central portion slightly protruding therefrom. Thus, as compared with the case that the end portion thereof is flat, the area of the part of the pin wire 84, which is in intimate contact with the electrically conductive material is large. Consequently, the enhancement of the reliability is expected.

Figure 30:
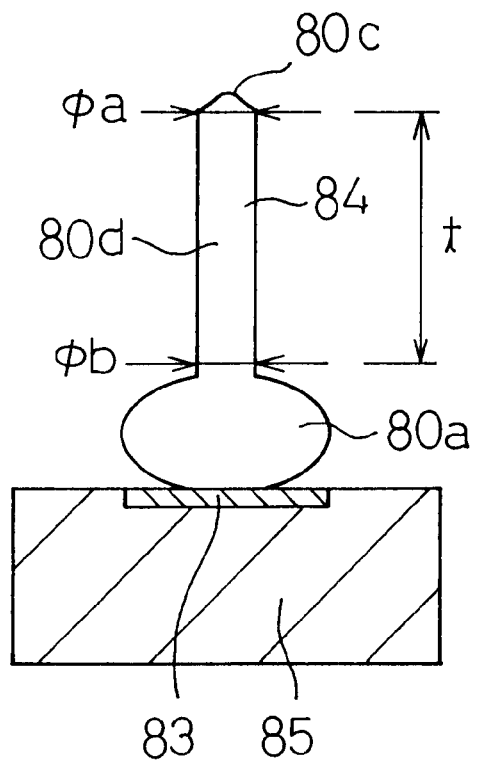
FIG. 30 is a schematic view illustrating a semiconductor device having pin wires.

FIG. 30 is a schematic view illustrating a semiconductor element 85 having the pin wire 84. The semiconductor element 85 comprises a semiconductor chip or semiconductor wafer having an IC circuit formed therein. Electrode pads connected to the IC circuit are formed on the surface of the semiconductor element 85. The electrode portion 83 is the electrode pad of the semiconductor element 85. The pin wire 84 has a cylindrical pin portion 80*d*. The diameter $\Phi a$ at the end of the pin portion 80*d* is nearly equal to that $\Phi b$ at the root thereof. The diameter of the enlarged portion 80*a* of the pin wire 84 is larger than those $\Phi a$ and $\Phi b$ of the pin portion 80*d*. The length "t" of the pin portion 80*d* is greater than the diameters $\Phi a$ and $\Phi b$ thereof.

Figure 31:
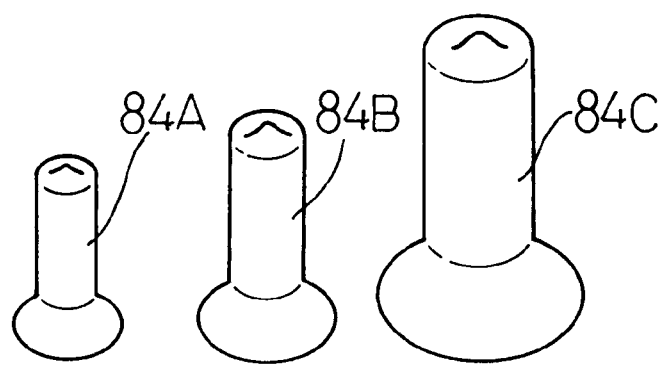
FIG. 31 is a view illustrating various kinds of pin wires.

FIG. 31 illustrates various examples of the pin wire. A pin wire 84A is an example in which the diameters $\Phi a$ and $\Phi b$ of the pin portion 80*d* are 30 $\mu$m. A pin wire 84B is an example in which the diameters $\Phi a$ and $\Phi b$ of the pin portion 80*d* are 50 $\mu$m. A pin wire 84C is an example in which the diameters $\Phi a$ and $\Phi b$ of the pin portion 80*d* are 70 $\mu$m. In this way, the pin wire 84B of desired size, length, and material can be obtained by selecting the metallic wire 80.

There are substantially no limits to the material, wire diameter (or pin diameter), and pin length of the metallic wire 84, and to the size of the enlarged portion 80*a*, of the metallic wire 80 to obtain pin wire 84 (84A, 84B, 84C). Moreover the pin wires 84 (84A, 84B, 84C) can be formed at very low cost, as compared with the case that solder balls for flip-chip devices and stud bumps are used. Furthermore, the length of the pin portion 80*d* can be freely changed, so a gang sealing utilizing transfer molding, which has been considered to be difficult to use for flip-chip devices in view of filler diameters, is enabled.

Figure 32A:
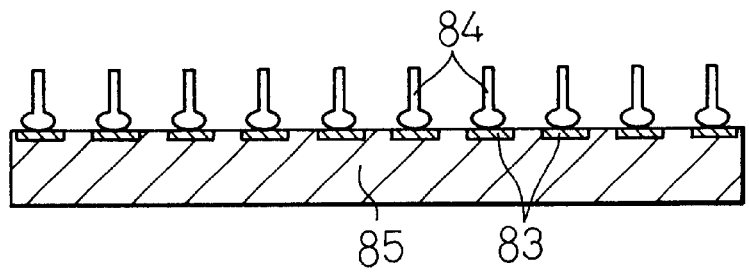
FIGS. 32A and 32B are views illustrating examples of the semiconductor device having pin wires.

FIG. 32A illustrates the semiconductor element 85 having the pin wires 84, which has been described with reference to FIGS. 27A to 30. Although only one pin wire 84 is shown in FIG. 30, the semiconductor element 85 usually has a large number of electrode portions (or electrode pads) 83, as shown in FIG. 32A, and the pin wires 84 are joined to respective electrode portions 83. A large number of pin wires 84 have nearly uniform length. The pin wires 84 can be arranged perpendicular to the surface of the semiconductor element 85 and at very small pitches. The pin wires 84 serve as the outer terminals.

Figure 32B:
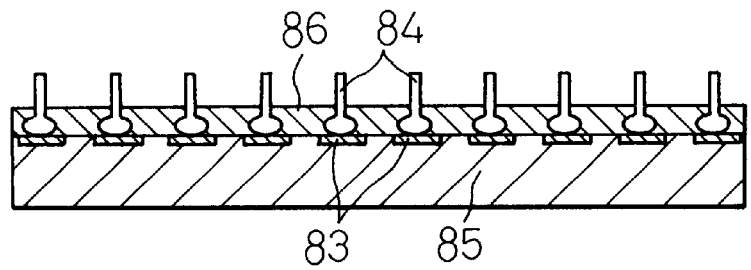

FIG. 32B illustrates an example in which a semiconductor package is obtained by sealing the semiconductor element 85 of FIG. 32A with a resin 86. The pin wires 84 project from the surface of the resin 86 and serve as the outer terminals.

Figure 33A:
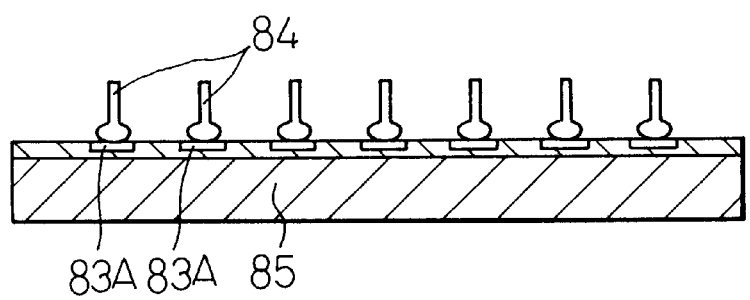
FIGS. 33A and 33B are view illustrating further examples of the semiconductor device having pin wires and re-wiring electrodes.

FIG. 33A illustrates the semiconductor element 85 in which the pin wires 84 are joined to re-wiring electrodes 83A formed by re-wiring techniques. In this case, a large number of pin wires 84 have an almost uniform length and serve as the outer terminals.

Figure 33B:
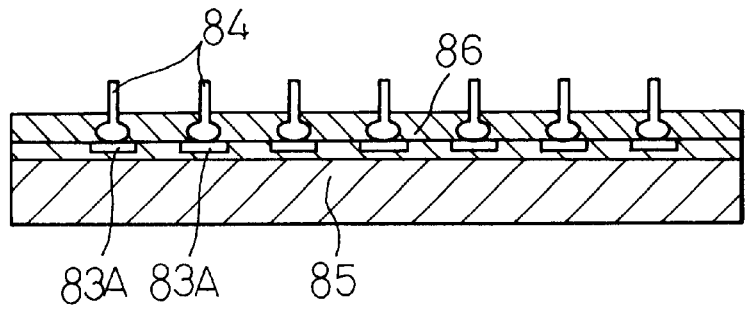

FIG. 33B illustrates an example in which a semiconductor package is obtained by sealing the semiconductor element 85 of FIG. 33A with a resin 86. The pin wires 84 project from the surface of the resin 86 and serve as the outer terminals.

Figure 34A:
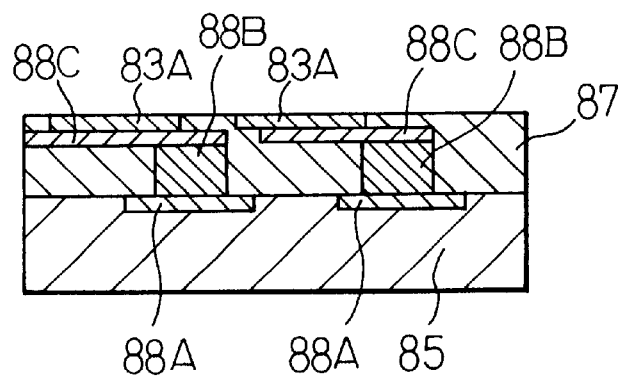
FIGS. 34A to 34C are views illustrating in detail the process of forming the semiconductor device of FIGS. 33A and 33B.
Figure 34B:
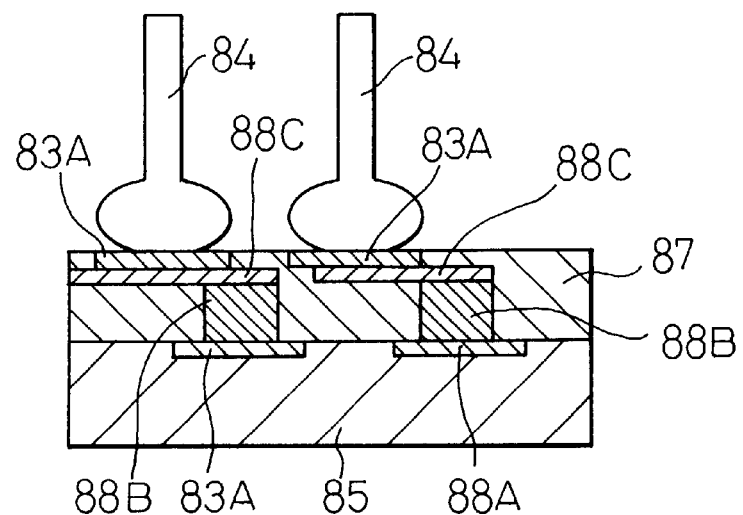
Figure 34C:
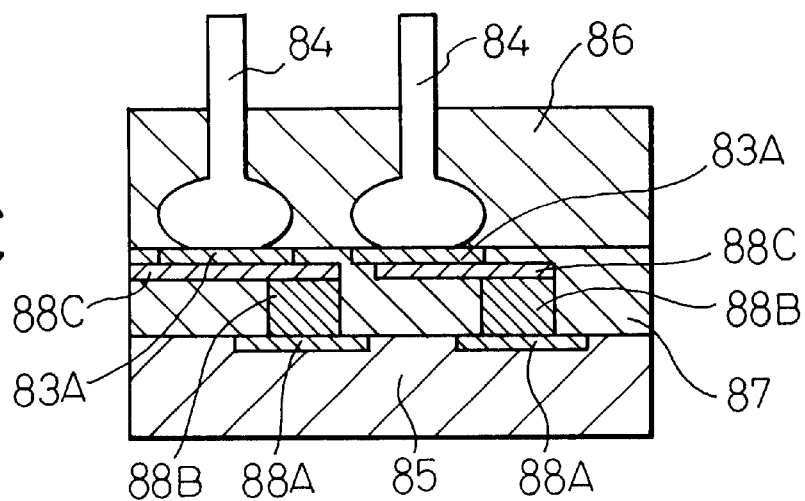

FIGS. 34A to 34C are views illustrating the details of the semiconductor element 85 in which the pin wires 84 are joined to the re-wiring electrodes 83A. As shown in FIG. 34A, the semiconductor element 85 has electrode pads 88A connected directly to the IC circuit. An insulating layer 87 is formed to cover the semiconductor element 85. Columnar electrodes 88B and electrically conductive films 88C are connected to the electrode pads 88A through openings in the insulating layer 87. The re-wiring electrodes 83A are connected to the electrically conductive films 88C in a suitable arrangement pattern. Although each of the re-wiring electrodes 83A is connected to a corresponding one of the electrode pads 88A, the positions of the re-wiring electrodes 83A differ from those of the electrode pads 88A.

As shown in FIG. 34B, the pin wires 84 are joined to the re-wiring electrodes 83A. As shown in FIG. 34C, the semiconductor element 85 is sealed with the resin 86 and thus becomes a semiconductor package.

The formation of the pin wires 84 using the wire bonding technique causes less damage to the circuit surface including the re-wiring electrodes (or electrode pads) 8A, so the pin wires 84 are suitable for being joined not only to the electrode pads of the semiconductor element 85 but to the electrodes 83A formed by the re-wiring techniques. Therefore, a semiconductor device, in which a plurality of semiconductor elements having pin portions 80d are stacked, can be obtained. Further, the values of the length "t", and the diameters Φa and Φb of the pin portion 80d can be freely selected on condition that the length "t" of the pin portion 80d does not exceed the diameters Φa and Φb thereof. The aforementioned features enable damage-free joints, chip stacking, flexible bonding, and low-cost gang sealing. Consequently, a light-weight and small semiconductor device, which can operate at a high speed and has a plurality of advanced functions, can be obtained.

Figure 35A:
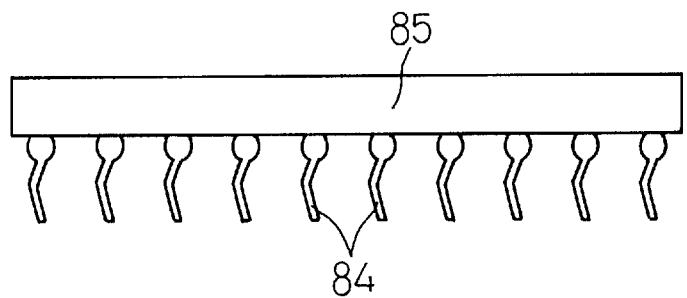
FIGS. 35A and 35B are views illustrating modifications of the pin wire.
Figure 35B:
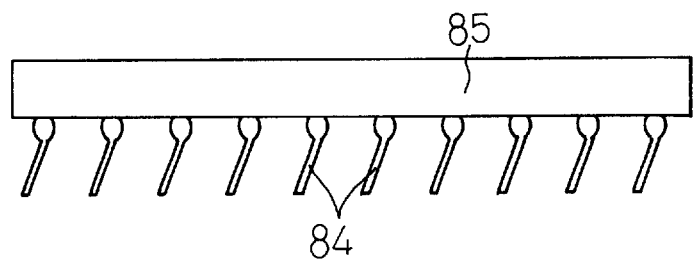

FIGS. 35A and 35B are views illustrating modifications of the pin wires 84. FIG. 35A illustrates an example of the pin wire 84 having a bent shape. FIG. 35B illustrates another example of the pin wire 84 obliquely joined to the semiconductor element. Such modified pin wires 84 are obtained by imposing a load thereon from the semiconductor element 85. Such modified pin wires 84 have an advantage in that stress is easily absorbed.

Figure 36:
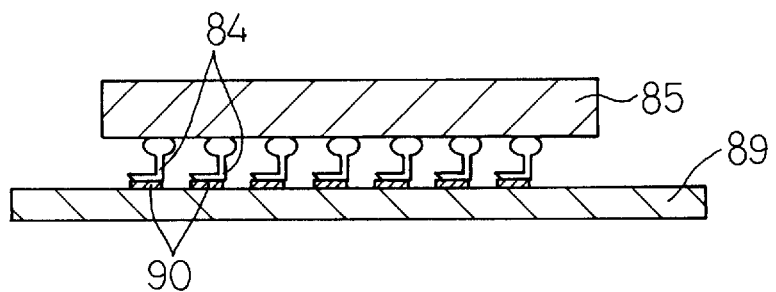
FIG. 36 is a view illustrating another example of the semiconductor device having pin wires.

FIG. 36 is a view illustrating another example of the semiconductor device having pin wires 84. In this example, the semiconductor element 85 illustrated in FIG. 32A is mounted on an interposer 89 by the pin wires 84 joined to the element 85. The pin wires 84 are bent at right angles, so that the contact area between the pin wires and the electrodes (not shown) provided in the interposer 89 is increased. Furthermore, an electrical conductive material 90 is interposed between the pin wire 84 and the corresponding electrode provided in the interposer 89. Incidentally, the pin wires 84 are bent at right angles by moving the semiconductor element 85 in a lateral direction with respect to the interposer 89.

Figure 37:
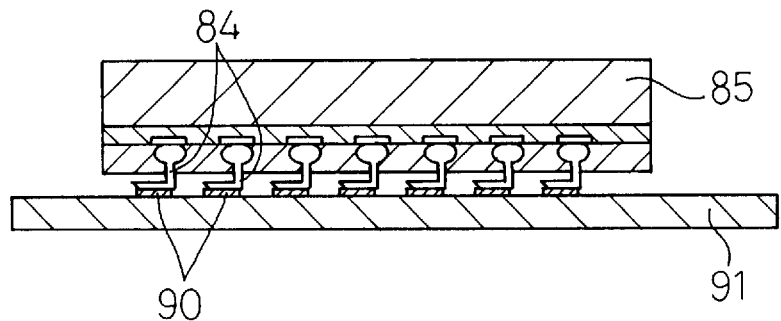
FIG. 37 is a view illustrating another example of the semiconductor device having pin wires.

FIG. 37 is a view illustrating still another example of the semiconductor device having the pin wires 84. In this example, the semiconductor element 85 illustrated in FIG. 33B is mounted on a mother board 91 by the pin wires 84 joined to the element 85. The pin wires 84 are bent at right angles, so that the contact area between the pin wires and the electrodes (not shown) provided in the mother board 91 is increased. Furthermore, electrically conductive material 90 is interposed between the pin wire 84 and the corresponding electrode provided in the mother board 91. Consequently, the electrical connection therebetween is more reliably established.

Figure 38A:
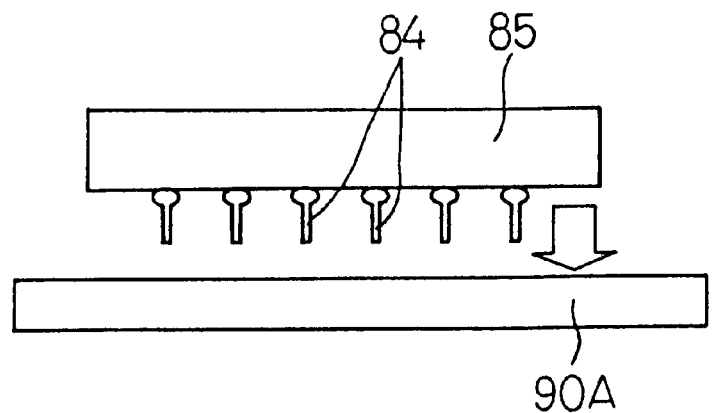
Figure 38B:
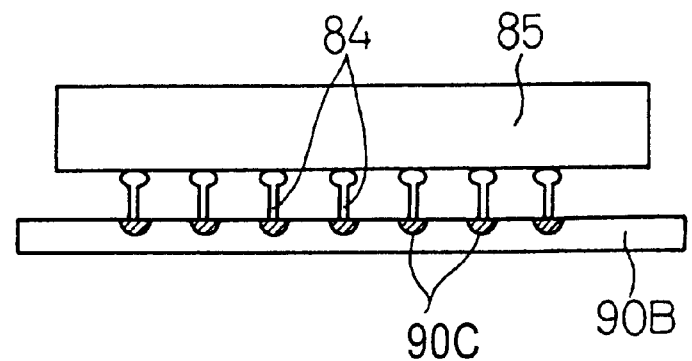
Figure 38C:
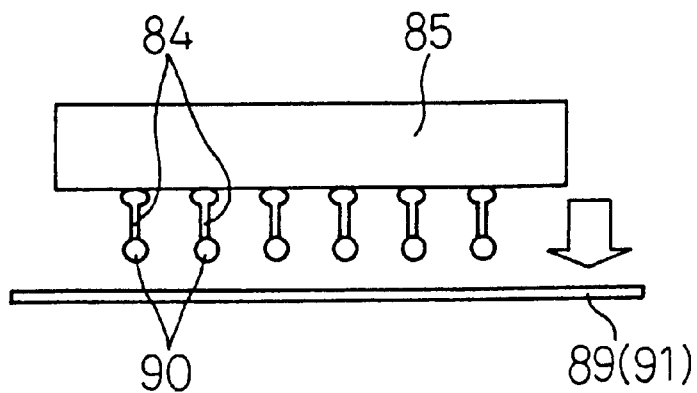

FIGS. 38A to 38C are views illustrating examples in which the electrically conductive material is adhered to the ends of the pin wires and bonded to the interposer or the mother board and joined thereto by being heated. In the case of the example shown in FIG. 38A, the pin wires 84 provided on the semiconductor element 85 are dipped into the electrically conductive material 90 in a bath 90A. Thus, the electrically conductive material 90 is adhered to the pin wires 84. In the case of an example illustrated in FIG. 38B, the pin wires 84 provided on the semiconductor element 85 are immersed into the electrically conductive material 90 accommodated in concave portions 90C of a forming plate 90B. Thus, the electrically conductive material 90 is adhered to the pin wires 84. FIG. 38C illustrates a state in which the semiconductor element 85 having the pin wires 84 and the electrically conductive material 90 are mounted on the interposer 89 or on the mother board 91. The method illustrated in FIG. 38B has an advantage in that the wetted amount of the electrically conductive material is easily managed.

Figure 39:
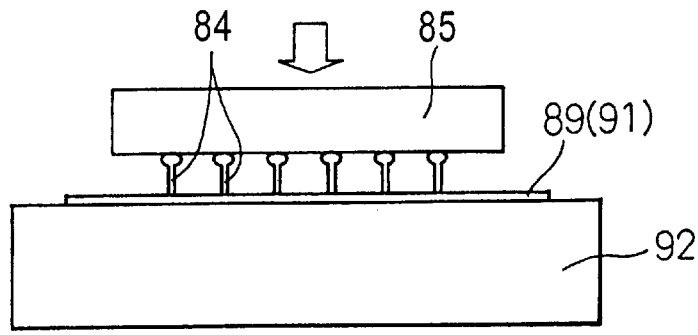
FIG. 39 is a view illustrating an example of joining pin wires by thermocompression bonding.

FIG. 39 is a view illustrating an example of the joining of the pin wires, which is performed by thermocompression bonding. The pin wires 84 provided in the semiconductor element 85 are mounted on the interposer 89 or the mother board 91 put on a heater 92. Each of the pin wires 84 is joined to a corresponding one of the electrodes (not shown) provided in the interposer 89 or the mother board 91 by being heated while a force, indicated by an arrow in this figure, is exerted onto the semiconductor element 85. In the case of utilizing the metallic bonding therebetween by the thermocompression bonding, the adhesion of the joint portion therebetween is very high.

Figure 54A:
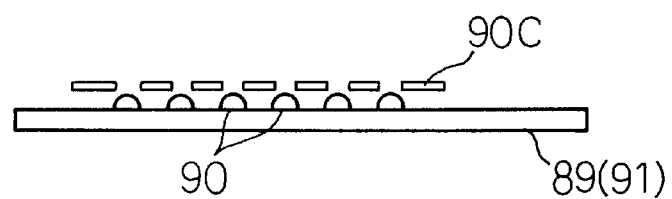
FIGS. 54A and 54B are views illustrating an example of joining pin wires to electrically conductive materials formed by printing.
Figure 54B:
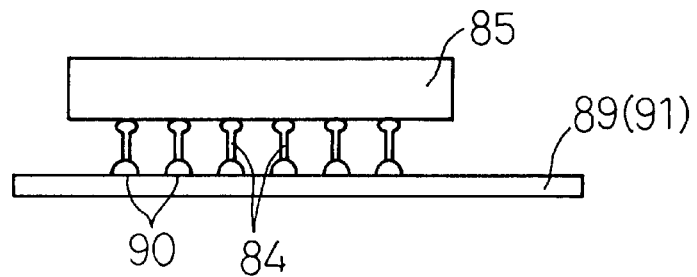

FIGS. 54A and 54B illustrate an example of joining of the pin wires by printing. As shown in FIG. 54A, the electrical conductive material 90 is printed on a corresponding one of the electrodes provided in the interposer 89 or the mother board 91 by using a printing mask 90C. Then, as illustrated in FIG. 54B, the pin wires 84 provided on the semiconductor element 85 are joined to the electrically conductive material.

Figure 40A:
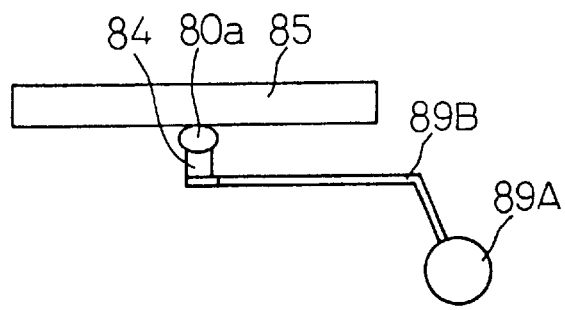
FIGS. 40A and 40B are views illustrating an example of impedance matching performed by changing the diameter of the pin wire.
Figure 40B:
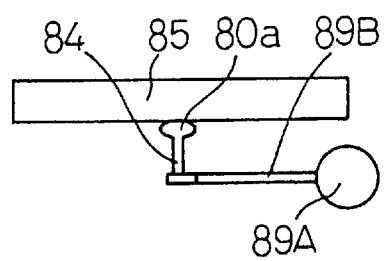

FIGS. 40A and 40B illustrate an example of impedance matching performed by changing the diameter of the pin wire 84. The interposer 89 has a land 89A and a wire 89B extending from the land 89A to an electrode connected to the pin wire 84. According to the design of the interposer 89, the length of the wire 89B may change. The length of the wire 89B shown in FIG. 40A is longer than that of the wire 89B shown in FIG. 40B. In such a case, the impedance matching is achieved by increasing the diameter of the pin wire 84 shown in FIG. 40A and decreasing the diameter of the pin wire 84 shown in FIG. 40B.

Figure 41A:
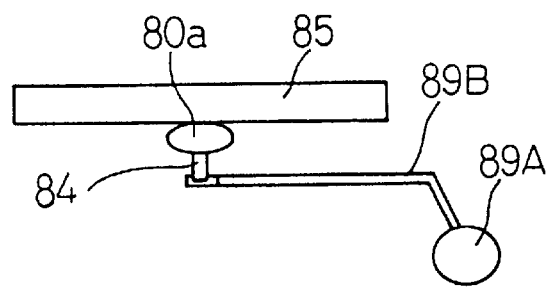
FIGS. 41A and 41B are views illustrating an example of impedance matching performed by changing the thickness of the enlarged portion provided at the end of the pin wire.
Figure 41B:
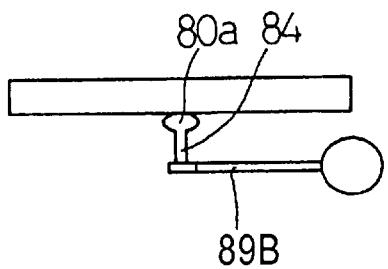

FIGS. 41A and 41B illustrate another example of the impedance matching performed by changing the diameter of the pin wire 84. In the case of this example, the thickness of the expansion portion 80a of the pin wire 84 is increased in the case of the long wire 89B shown in FIG. 41A, while the thickness of the expansion portion 80a of the pin wire 84 is increased in the case of a short wire 89B shown in FIG. 41B.

Thus, to reduce a signal delay between the wires, which is a problem in a high-speed semiconductor device operating in the several MHz band, the relative resistance is lowered by increasing the wire diameter or the thickness of the expansion portion in the case of the long wire. Consequently, the value of the impedance between the wires is controlled, so that a signal delay is reduced.

Figure 42A:
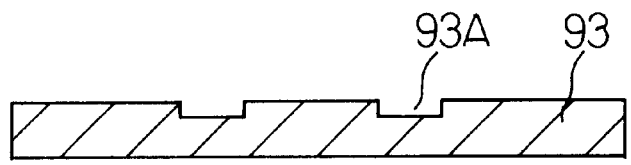
FIGS. 42A to 42E are views illustrating an example of the semiconductor device in which pin wires are joined by plating portions.
Figure 42B:
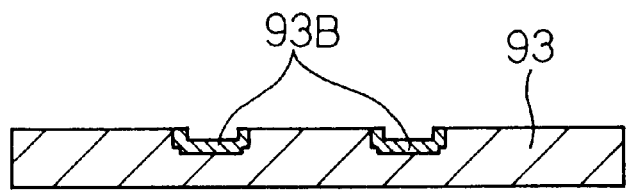
Figure 42C:
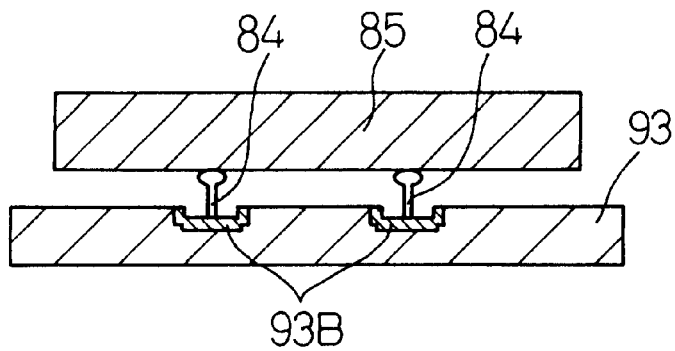
Figure 42D:
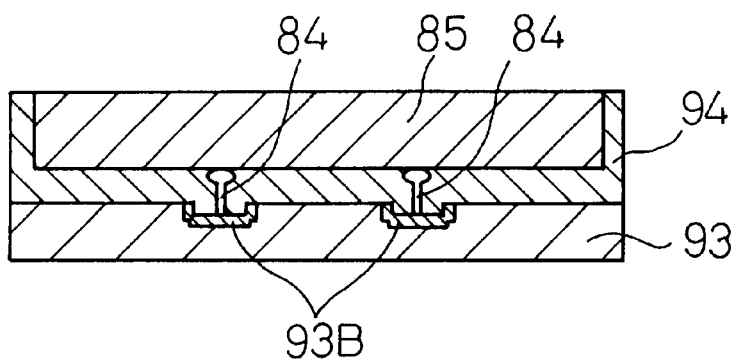
Figure 42E:
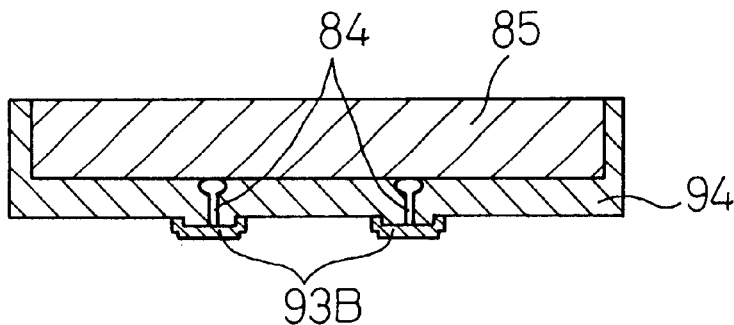

FIGS. 42A to 42E illustrate an example of the semiconductor device in which the pin wires are joined by a plating portion. First, as illustrated in FIG. 42A, a lead frame 93, in which concave portions 93A are formed, is prepared. Then, as illustrated in FIG. 42B, plating portions 93B are formed by plating the surface of the concave portion 93A. Subsequently, as illustrated in FIG. 42C, the ends of the pin wires 84 are joined to the plating portions 93B. The ends of the pin wires 84 of the semiconductor element 85 are easily joined to the plating portions 93B by thermocompression bonding. Then, as illustrated in FIG. 42D, the semiconductor element 85 is sealed with resin a 94. The space between the semiconductor element 85 and the lead frame 93 is filled with the resin 94. Subsequently, as illustrated in FIG. 42E, the lead frame 93 is etched by chemical etching to expose the plating portions 93B. The plating portions 93B adhere to the ends of the pin wires 84. Thus, the pin wires 93B serve as the outer terminals, together with the pin wires 84. Such a technique can realize semiconductor devices, which are small in size and have a fine pitch and operate at a high speed, as compared with a face-up type BCC (Bump Chip Carrier) package.

Figure 43A:
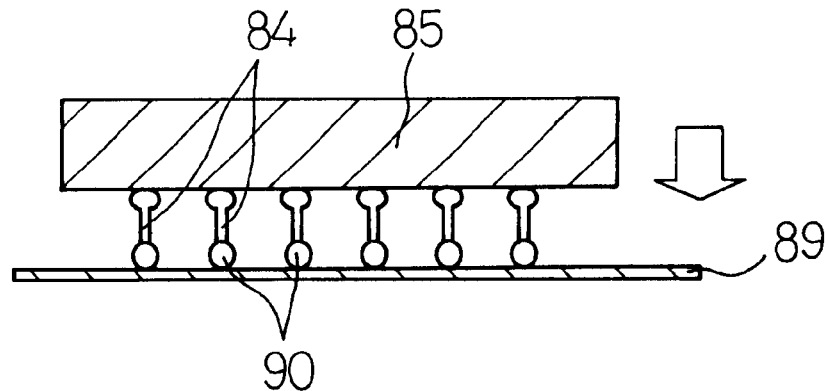
FIGS. 43A to 43C are views illustrating an example of the semiconductor device having pin wires.
Figure 43B:
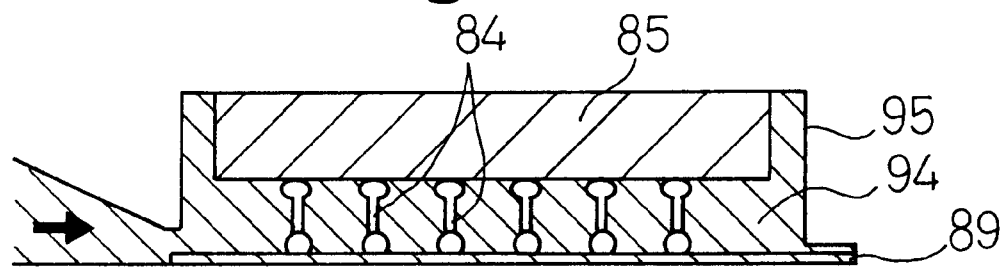
Figure 43C:
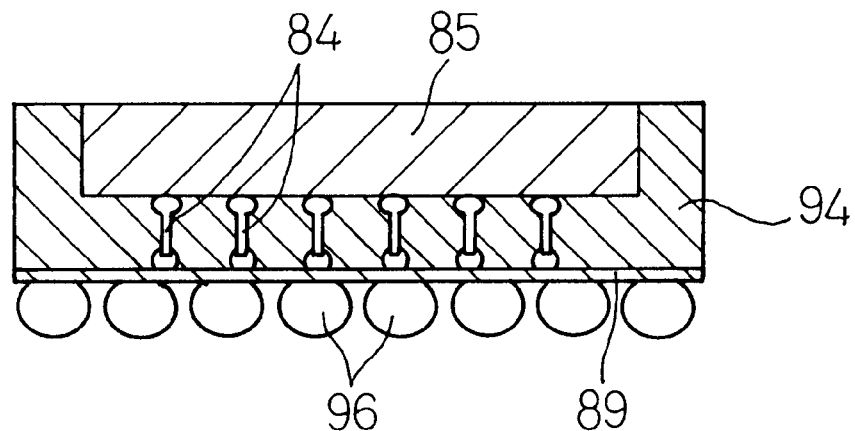

FIGS. 43A to 43B are views illustrating an example of the semiconductor device having the pin wires. FIG. 43A illustrates an example in which the semiconductor element 85 is mounted on the interposer 89 by the pin wires 84, to which the electrically conductive materials 90 are adhered. FIG. 43B illustrates an example in which transfer molding is performed on the semiconductor device shown in FIG. 43A. The resin 94 is poured into a die 95. Even in the case that the pin wires 84 are placed at a high density, the transfer molding can be performed. Then, as illustrated in FIG. 43C, the die 95 is removed. Metallic balls 96 are joined to the opposite surface of the interposer 89. Thus, a semiconductor package is completed.

Figure 44:
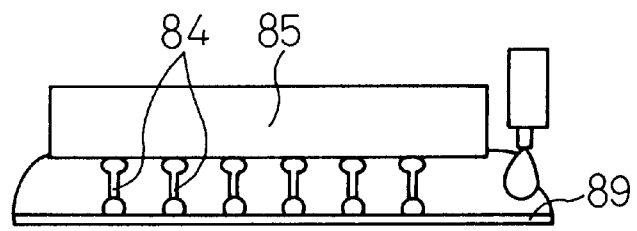
FIG. 44 is a view illustrating another example of resin sealing of the semiconductor device.

FIG. 44 is a view illustrating another example of the resin-sealing. The resin-sealing may be performed by potting, instead of the transfer molding illustrated in FIG. 43B.

Figure 45A:
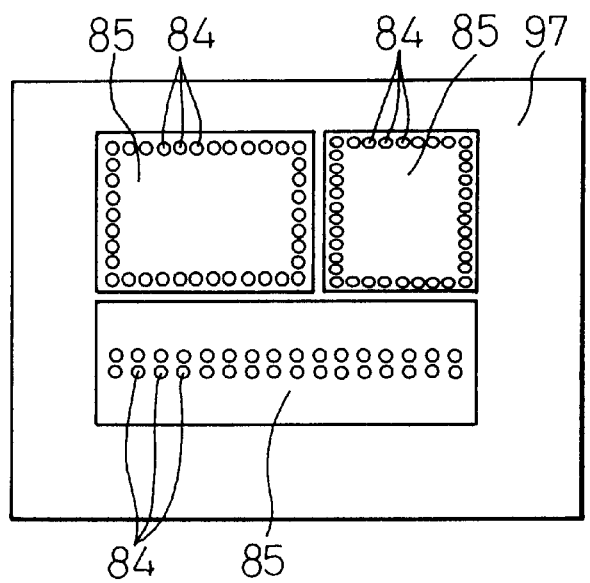
FIGS. 45A and 45B are plan views illustrating an example of the semiconductor device.
Figure 45B:
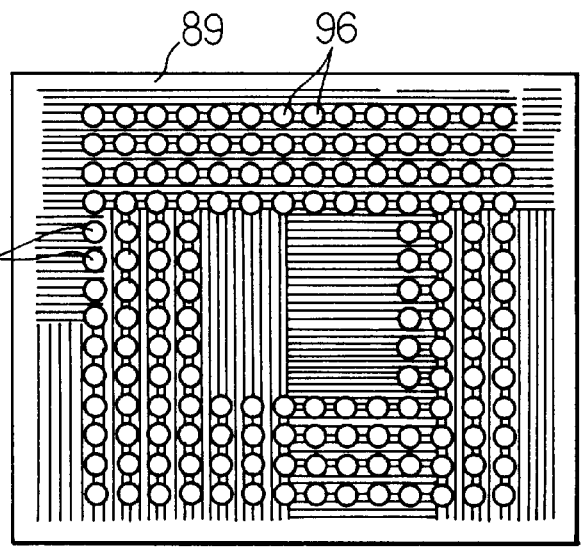
Figure 46A:
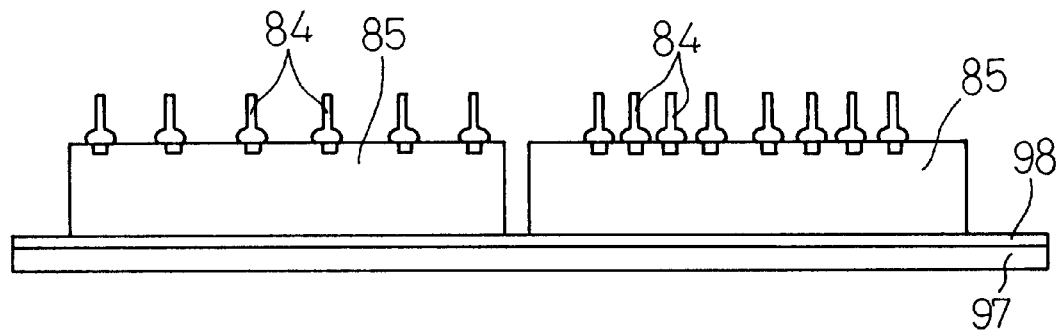
FIGS. 46A to 46C are views illustrating an example of the semiconductor device of FIGS. 45A and 45B, including a plurality of semiconductor elements arranged in a plane.
Figure 46B:
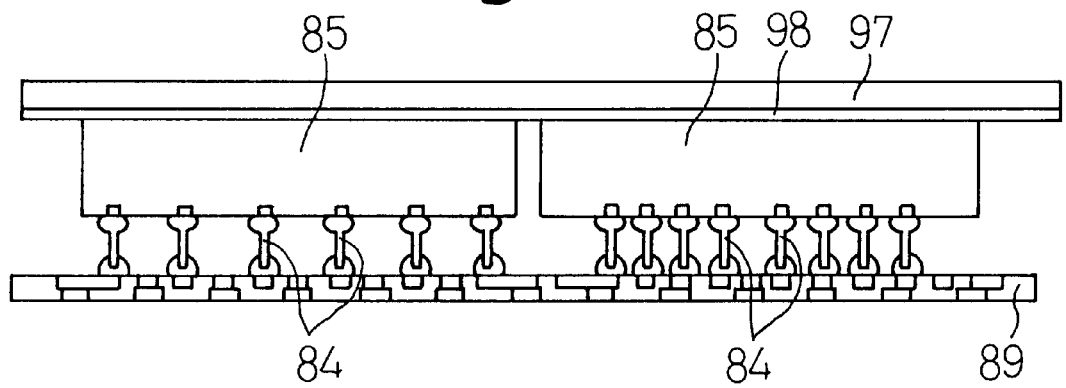
Figure 46C:
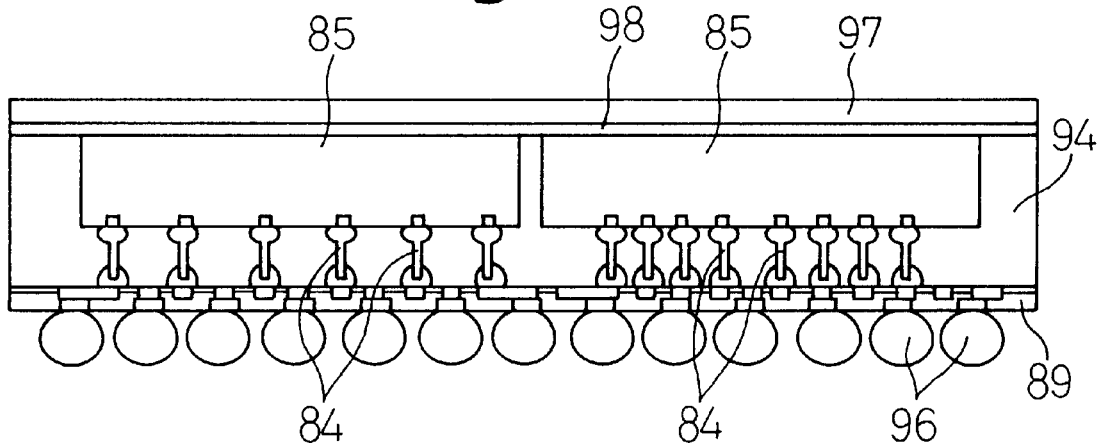

FIG. 45A is a plan view of an example of the semiconductor device. FIG. 46A is a view illustrating an example of the semiconductor device of FIG. 45A which includes a plurality of semiconductor elements arranged in a plane. As illustrated in FIGS. 45A and 45B, a plurality of semiconductor elements 85 having pin wires 84 are arranged in a plane on a metallic plate 97. Electrically conductive materials 90 are adhered to the pin wires 84. The plurality of semiconductor elements 85 are fixed to the metallic plate 97 by an adhesive agent 98. As illustrated in FIG. 46B, the plurality of semiconductor elements 85 are mounted on the interposer 89 by the pin wires 84. Then, as illustrated in FIG. 46C, the semiconductor elements 85 are sealed with a resin 94. Further, metallic balls 96 are joined onto the opposite surface of the interposer 89. Thus, a semiconductor package is completed. FIG. 45B illustrates the arrangement of the metallic balls 96.

Figure 47:
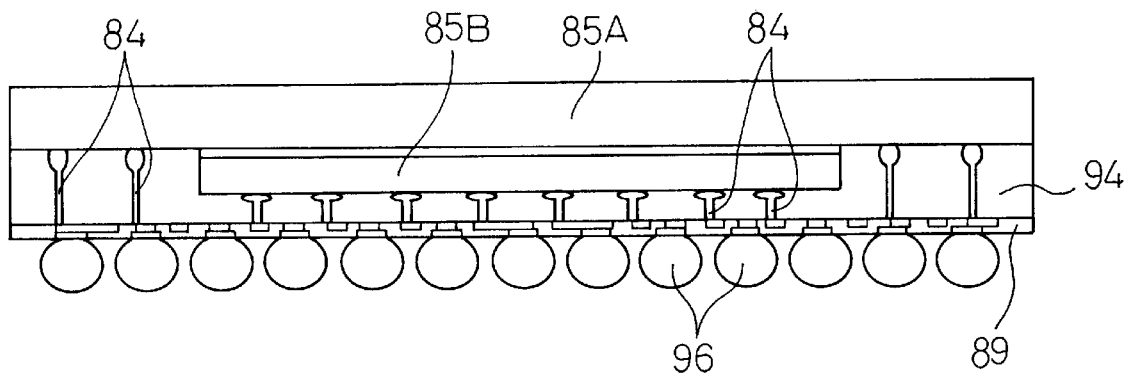
FIG. 47 is a view illustrating an example of the semiconductor device that includes a plurality of semiconductor elements arranged in a three-dimensional manner.

FIG. 47 is a view illustrating an example of the semiconductor device that includes a plurality of semiconductor elements 85 arranged in a three-dimensional manner. In this example, the circuit-surface side of the semiconductor element 85A is fixed and bonded to the rear-surface side of the semiconductor element 85B by an adhesive agent. Each of these semiconductor elements 85A and 85B has pin wires 84. Moreover, the semiconductor elements 85A and 85B are mounted on the interposer 89 by the pin wires 84. Furthermore, the semiconductor elements 85A and 85B are sealed with the resin 94. The metallic balls 96 are joined to the opposite surface of the interposer 89. Thus, a semiconductor package is completed.

Figure 48:
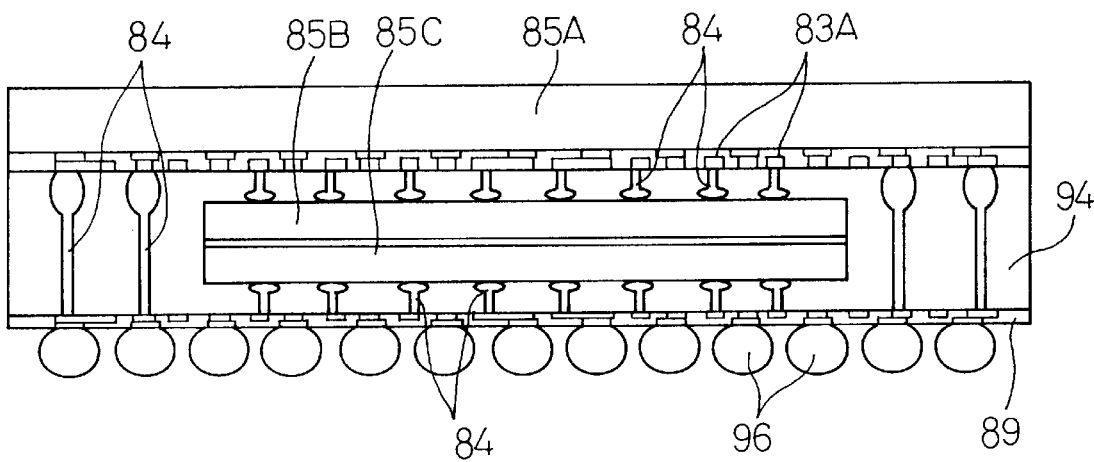
FIG. 48 is a view illustrating another example of the semiconductor device including a plurality of semiconductor elements arranged in a three-dimensional manner.

FIG. 48 is a view illustrating another example of the semiconductor device that includes a plurality of semiconductor elements arranged in a three-dimensional manner. In this example, the semiconductor element 85A has pin wires 84 and a rewiring electrode 83A as illustrated in, for example, FIG. 34C. The semiconductor elements 85B and 85C, each of which has the pin wires 84, are placed back to back and fixed to each other. The pin wires 84 of the semiconductor element 85B are joined to the rewiring electrode 83A of the semiconductor element 85A. On the other hand, the semiconductor elements 85A and 85B are sealed with the resin 94. The metallic balls 96 are joined to the opposite surface of the interposer 89. Thus, a semiconductor package is completed.

Figure 49:
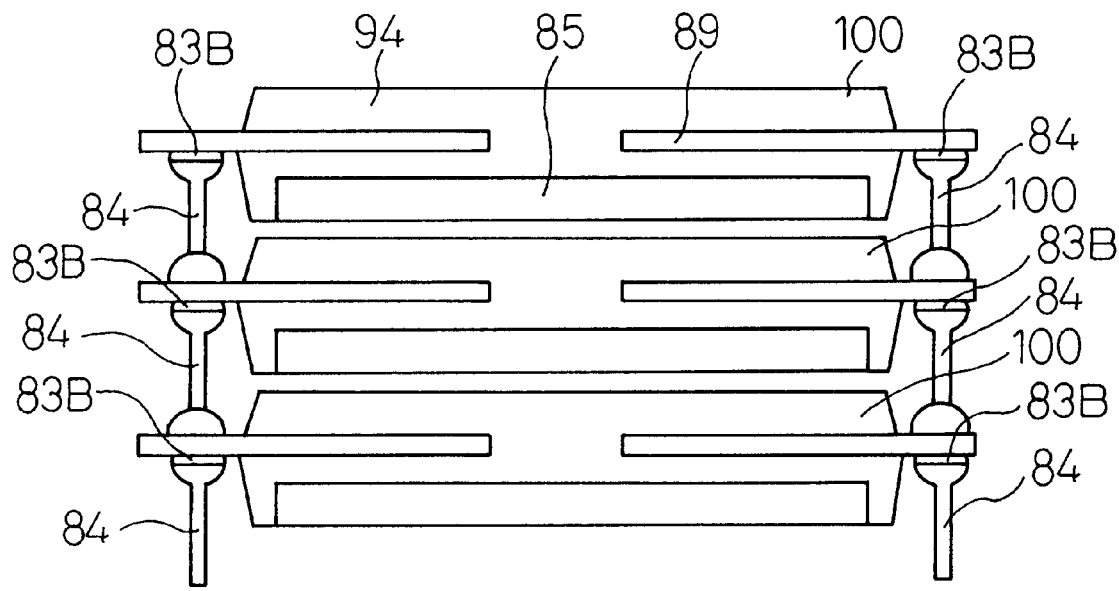
FIG. 49 is a view illustrating an example of the semiconductor apparatus including a stack of a plurality of semiconductor devices arranged in a three-dimensional manner.

FIG. 49 is a view illustrating an example of a semiconductor apparatus that includes a stack of a plurality of semiconductor devices arranged in a three-dimensional manner. Reference numeral 100 designates a semiconductor device (or semiconductor package) that comprises a semiconductor element 85, an interposer 89, and resin 94 for resin-sealing the semiconductor element 85 and the interposer 89. The semiconductor element 85 and the interposer 89 are connected to each other by a suitable conductor (not shown).

As shown in FIG. 49, three semiconductor devices (or semiconductor packages) 100 are placed in a three-dimensional manner. Each interposer 89 extends in a lateral direction from the resin 94. An extension portion of the interposer 89 has an electrode portion 83B. Pin wires 84 are joined to the electrode portion 83B. The joint of the pin wires 84 to the electrode portion 83B is performed similarly as described above. The pin wires 84 connect two semiconductor devices (or semiconductor packages) 100, which are adjacent to each other in an upward or downward direction, to each other. In the case of using the pin wires as connecting terminals for stacking the packages, a transmission path can be decreased, in comparison with that in the case of employing the conventional techniques. This has an advantage in high-speed transmission.

Figure 50:
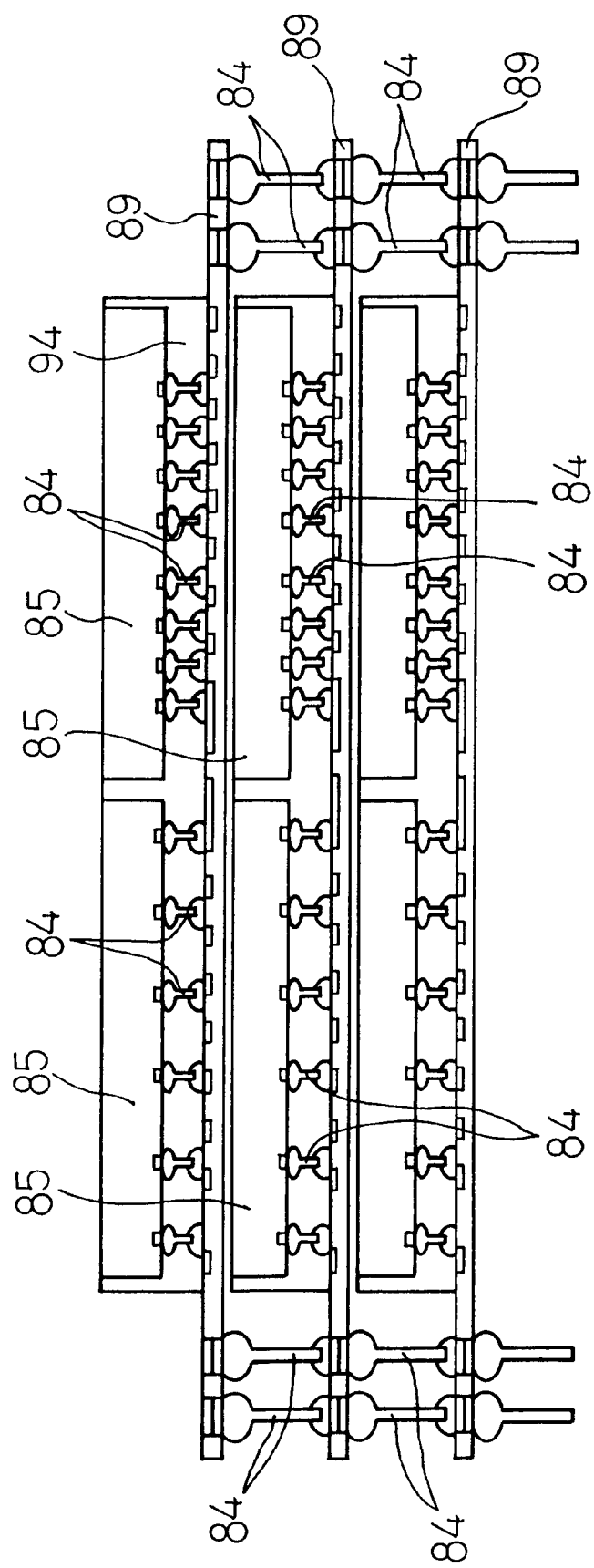
FIG. 50 is a view illustrating another example of the semiconductor apparatus that includes a stack of a plurality of semiconductor devices arranged in a three-dimensional manner.

FIG. 50 is a view illustrating another example of the semiconductor apparatus that includes a stack of a plurality of semiconductor devices arranged in a three-dimensional manner. As shown in FIG. 50, three semiconductor devices (or semiconductor packages) 100 are placed in a three-dimensional manner. In the apparatus of FIG. 50, the semiconductor element 85 and the interposer 89 of each of the semiconductor devices (or semiconductor packages) 100 are joined to each other by the pin wires 84. Further, the pin wires 84 are joined to an extension portion of the interposer 89. Thus, the pin wires 84 are placed in each of the semiconductor devices (or semiconductor packages) 100. In addition, the pin wires 84 connect the adjoining two semiconductor devices (or semiconductor packages) 100.

In the semiconductor element 53, and the semiconductor devices, and the semiconductor packages described above, the length and diameter of each of the pin wires 84 can be changed as desired. Further, needless to say, the joint of the pin wires 84 can be formed in each of the semiconductor devices, and in the wafer, and even after the packages are produced.

Figure 51A:
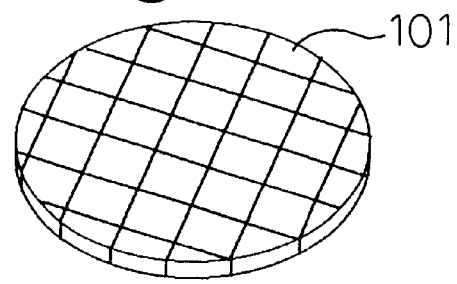
FIGS. 51A to 51C are views illustrating an example of a method of manufacturing a semiconductor device having pin wires.
Figure 51B:
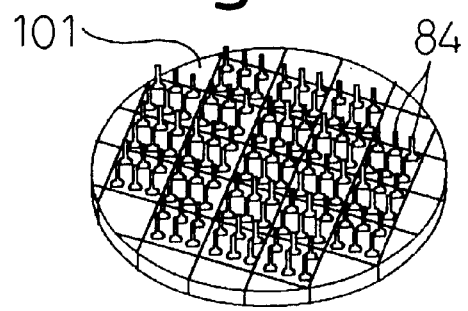
Figure 51C:
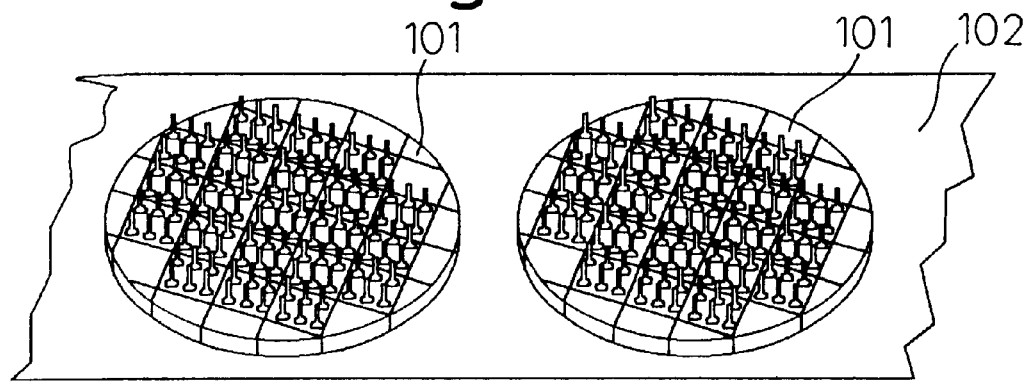

FIGS. 51A to 53 are diagrams illustrating an example of a method of manufacturing the semiconductor device having pin wires. As illustrated in FIG. 51A, a semiconductor wafer 101 is prepared. Then, an integrated circuit and electrode pads are formed thereon. Moreover, if necessary, a rewiring electrode is formed. Then, as illustrated in FIG. 51B, the pin wires 84 are joined to an electrode portion (namely, an electrode pad or a rewiring electrode) 83. Further, as illustrated in FIG. 51C, adhesive tape is made to adhere to a surface, which is opposite to the pin wires 84, of the semiconductor wafer 101.

Figure 52:
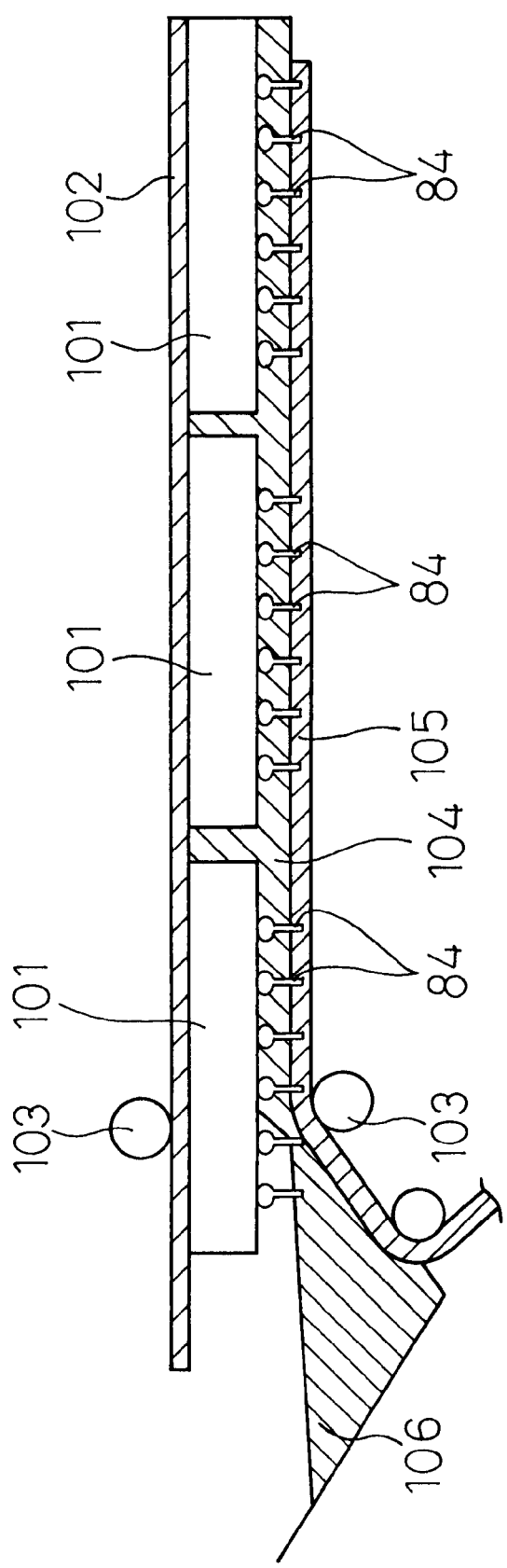
FIG. 52 is a view illustrating the step of resin sealing of the semiconductor device of FIGS. 51A to 51C.

As illustrated in FIG. 52, a PET sheet 105 coated with resin 104 is made to adhere to a surface of the semiconductor wafer 11, which surface is at the side of the pin wires 84, while the semiconductor-wafer 101 and the adhesive tape 102 are run between a pair of thickness adjusting rollers 103. A bath 106 contains low elasticity resin varnish. The PET sheet 105 goes along the surface of the pin wire 84 of the semiconductor wafer 101 by simultaneously passing through the bath 106. The space between the semiconductor wafer 101 and the PET sheet 105 is filled with the low elasticity resin varnish to the extent that the end of the pin wires 84 is projected therefrom. The dried low elasticity resin varnish becomes mold resin 104.

Figure 53:
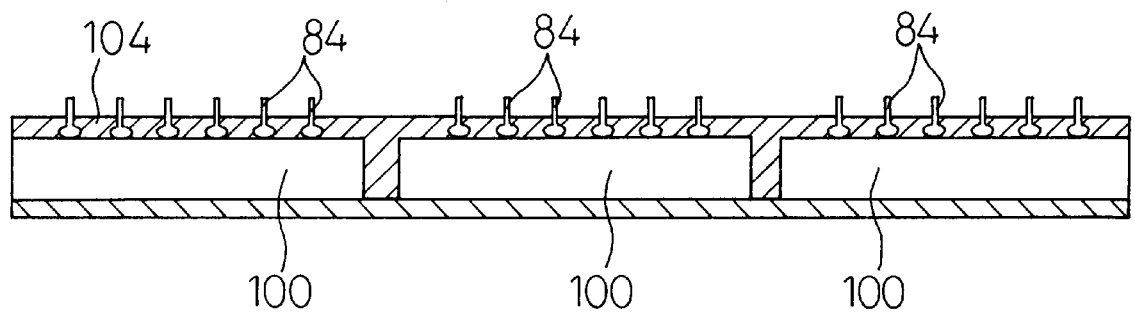
FIG. 53 is a view illustrating the step of dicing the semiconductor device of FIG. 52.

Then, as illustrated in FIG. 53, the PET sheet 105 is removed therefrom at a suitable time. Subsequently, dicing is performed, so that the semiconductor wafer 101 is divided into individual semiconductor chips. The semiconductor chips, to which the wafer is divided, have already become resin-sealed semiconductor packages. Finally, the individual semiconductor chips are removed from the adhesive tape 102. In the case of this method, techniques for bonding sheet type adhesive agents to each other are applied thereto. Thus, the number of steps can be decreased. Moreover, the cost of facilities can be considerably reduced.

Figure 55:
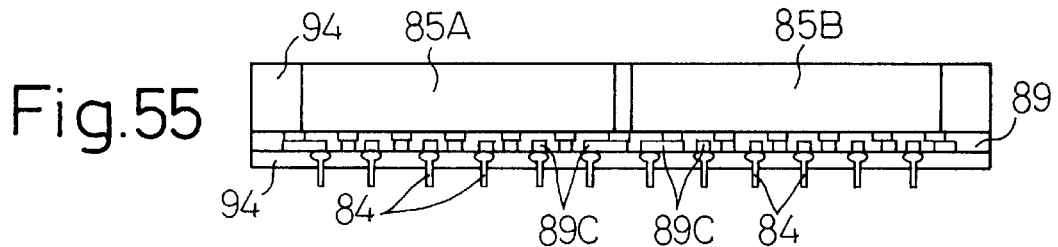
FIG. 55 is a view illustrating an example of the semiconductor device including a plurality of semiconductor elements.

FIG. 55 is a view illustrating an example of the semiconductor device that includes a plurality of semiconductor elements. In this example, two semiconductor elements 85A and 85B are mounted on a single interposer 89. The interposer 89 has rewiring electrodes 89C. The rewiring electrode 89C has a first electrode portion formed correspondingly to each of the electrode pads of the semiconductor elements 85A and 85B, and also has a second electrode portion connected to the first electrode portion and disposed by changing the position thereof. The electrode pads of the semiconductor elements 85A and 85B are connected to the first electrode portion of the rewiring electrode 89C. The pin wires 84 are joined to the second electrode portion of the rewiring electrode 89C. The semiconductor device formed in this way is sealed with resin 94. The pin wires 84 projects from the resin 94.

Figure 56:
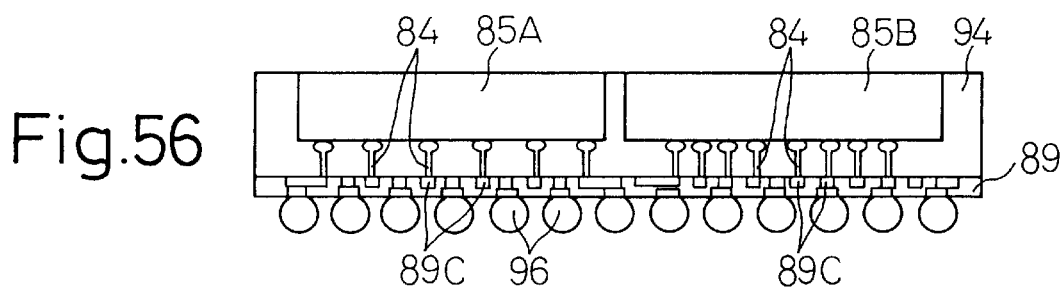
FIG. 56 is a view illustrating another example of the semiconductor device that includes a plurality of semiconductor elements.

FIG. 56 is a view illustrating another example of the semiconductor device that includes a plurality of semiconductor elements. In this example, two semiconductor elements 85A and 85B are mounted on a single interposer 89. The interposer 89 has rewiring electrodes 89C. The rewiring electrode 89C has a first electrode portion formed correspondingly to each of the electrode pads of the semiconductor elements 85A and 85B, and also has a second electrode portion connected to the first electrode portion and disposed by changing the position thereof. The pin wires 84 are joined to the electrode pads of the semiconductor elements 85A and 85B. The end portions of the pin wires 84 are joined to the first electrode portion of the rewiring electrode 89C. Metallic balls 96 are joined to the second electrode of the rewiring electrode 89C. The semiconductor device formed in this way is sealed with resin 94. The metallic balls 96 serve as the external terminals.

Figure 57:
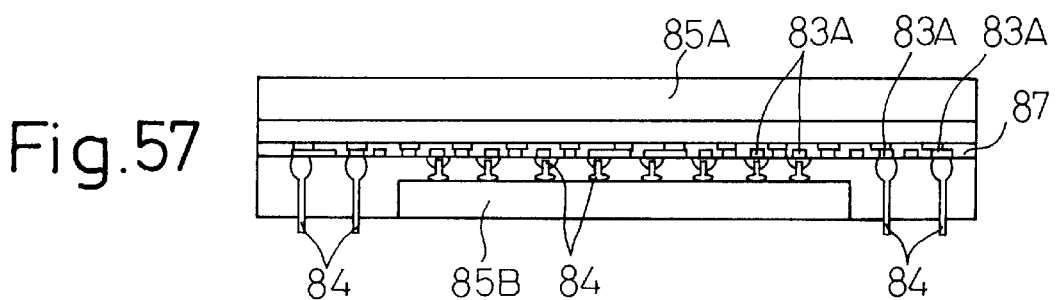
FIG. 57 is a view illustrating another example of the semiconductor device that includes a plurality of semiconductor elements.

FIG. 57 is a diagram illustrating still another example of the semiconductor device that includes a plurality of semiconductor elements. In this example, two semiconductor elements 85A and 85B are mounted on a single interposer 89. The semiconductor element 85A has rewiring electrodes 89C. A group of pin wires 84 are joined to the electrode pad of the semiconductor element 85B. The ends of these pin wires 84 are joined to a group of rewiring electrodes 89C of the semiconductor element 85A. Another group of pin wires 84 are joined to a group of rewiring electrodes 89C of the semiconductor element 85A. The semiconductor device formed in this way is sealed with resin 94. The group of pin wires 84 project from the resin 94.

Figure 58:
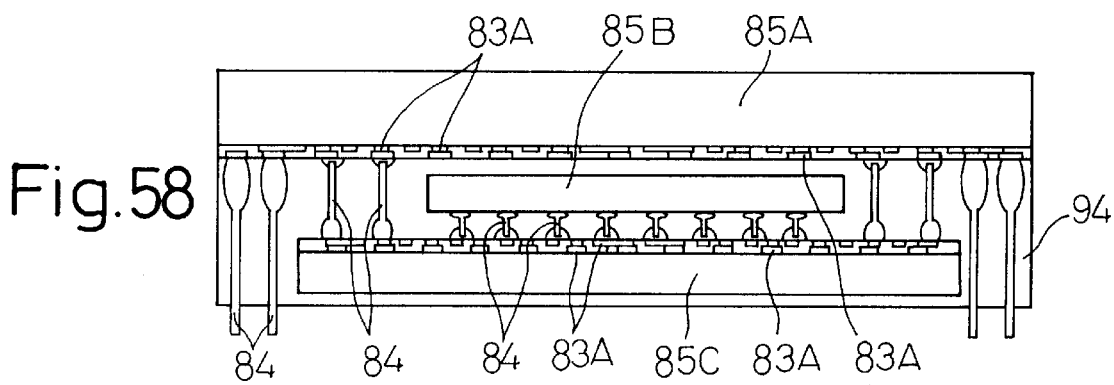
FIG. 58 is a view illustrating another example of the semiconductor device that includes a plurality of semiconductor elements.

FIG. 58 is a diagram illustrating an example of a semiconductor device including a plurality of semiconductor elements. In this example, three semiconductor elements 85A and 85B are mounted on an interposer 89. The semiconductor element 85A has rewiring electrodes 83A. Similarly, the semiconductor element 85C has rewiring electrodes 83A. A group of pin wires 84 are joined to the electrode pads of the semiconductor element 85B. End portions of these pin wires 84 are joined to a group of rewiring electrodes 83A of the semiconductor element 85C. Another group of pin wires 84 are joined to the group of rewiring electrodes 83A of the semiconductor element 85C. End portions of these pin wires 84 are connected to the group of the rewiring electrodes 83A of the semiconductor element 85A. The semiconductor device formed in this way is sealed with resin 94. The group of pin wires 84 project from the resin 94.

As above described, according to the present invention, a semiconductor device, which has superior durability to thermal stress, can be provided. Further, stress generated between the columnar electrodes and the outer terminals provided in the semiconductor device can be dispersed. The reliability of the joint portion therebetween against the influence of temperature cycles and mechanical stress can be enhanced.

What is claimed is:

1. A semiconductor device comprising:
    a semiconductor element having a plurality of electrode pads;
    a plurality of columnar electrodes connected to said plurality of electrode pads;
    a resin layer covering said semiconductor element and said columnar electrodes and having a surface; and
    outer terminals disposed on the surface of said resin layer in such a way as to be electrically connected to said columnar electrodes;
    wherein each of said columnar electrodes comprises a wire portion extending from said electrode pad of said semiconductor element, and an enlarged portion extending from said outer terminal and having a cross-sectional area greater than that of said wire portion.

2. The semiconductor device according to claim 1, wherein said resin layer comprises a first soft resin sub-layer formed on a surface of said semiconductor element, and a second resin sub-layer disposed on the opposite side of said first resin sub-layer from said semiconductor element and having elasticity higher than that of said first resin sub-layer.

3. The semiconductor device according to claim 1, wherein said enlarged portion of said columnar electrode comprises an extension part of said wire portion subjected to a wall-thickening treatment.

4. The semiconductor device according to claim 1, wherein said enlarged portion of said columnar electrode includes an electrically conductive material attached to said wire portion.

5. A semiconductor device comprising:
- a semiconductor element having a plurality of electrode pads;
- a plurality of columnar electrodes connected to said plurality of electrode pads;
- a resin layer covering said semiconductor element and said columnar electrodes and having a surface;
- outer terminals disposed on the surface of said resin layer in such a way as to be electrically connected to said columnar electrodes; and
- re-wiring conductor portions provided between said electrode pads of said semiconductor element and said columnar electrodes;
- wherein said resin layer is made of relatively soft resin which is spin-coated.

6. The semiconductor device according to claim 5, wherein said resin layer is made of one of a silicone resin and an epoxy resin.

7. The semiconductor device according to claim 5, wherein said columnar electrode comprises a wire.

8. The semiconductor device according to claim 5, wherein each of said columnar electrodes is formed by partially expanding a wire.

9. The semiconductor device according to claim 5, wherein said columnar electrode is formed by joining a plurality of wires into a single columnar electrode.

10. The semiconductor device according to claim 5, further comprising dummy electrodes disposed in said resin layer substantially parallel to said columnar electrodes.

11. A semiconductor device comprising:
- a semiconductor element having a plurality of electrode pads;
- a plurality of columnar electrodes connected to said plurality of electrode pads;
- a resin layer covering said semiconductor element and said columnar electrodes and having a surface;
- re-wiring conductor portions provided on the surface of said resin layer in such a way as to be connected to said columnar electrodes;
- an insulating layer covering said resin layer and part of said re-wiring conductor portions; and
- outer terminals electrically connected to part of said re-wiring conductor portions, which part is exposed from said insulating layer.

* * * * *